US008826530B2

(12) United States Patent
Niki et al.

(10) Patent No.: US 8,826,530 B2
(45) Date of Patent: Sep. 9, 2014

(54) METHOD FOR MANUFACTURING SUBSTRATE WITH METAL FILM

(75) Inventors: Ayao Niki, Ogaki (JP); Atsushi Ishida, Gifu (JP); Ryojiro Tominaga, Gifu (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 567 days.

(21) Appl. No.: 12/732,635

(22) Filed: Mar. 26, 2010

(65) Prior Publication Data

US 2010/0243305 A1 Sep. 30, 2010

Related U.S. Application Data

(60) Provisional application No. 61/165,308, filed on Mar. 31, 2009.

(51) Int. Cl.
| H01K 3/10 | (2006.01) |
| H05K 3/46 | (2006.01) |
| H05K 3/00 | (2006.01) |
| C25D 7/12 | (2006.01) |
| H05K 3/42 | (2006.01) |
| C25D 5/02 | (2006.01) |
| H05K 3/38 | (2006.01) |

(52) U.S. Cl.
CPC ............. *H05K 3/0032* (2013.01); *H05K 3/387* (2013.01); *H05K 3/4602* (2013.01); *H05K 2203/1572* (2013.01); *H05K 2201/09581* (2013.01); *H05K 2203/095* (2013.01); *H05K 2201/09536* (2013.01); *C25D 7/12* (2013.01); *H05K 3/422* (2013.01); *C25D 5/02* (2013.01); *H05K 2201/09827* (2013.01)
USPC .................. 29/852; 29/825; 29/846; 427/487; 427/510; 427/554

(58) Field of Classification Search
USPC ............ 29/852, 825, 846, 851; 174/255, 258, 174/262, 266; 427/96.1, 124, 487, 510, 427/554, 555
See application file for complete search history.

(56) References Cited

U.S. PATENT DOCUMENTS

| 6,518,515 | B2 * | 2/2003 | Nishii et al. ................... 174/262 |
| 7,849,593 | B2 * | 12/2010 | Kawamura et al. ............. 29/846 |
| 2010/0095523 | A1 | 4/2010 | Niki |

FOREIGN PATENT DOCUMENTS

WO   WO2007/116057 A2   10/2007

OTHER PUBLICATIONS

U.S. Appl. No. 12/607,666, filed Oct. 28, 2009, Niki, et al.

* cited by examiner

*Primary Examiner* — Thiem Phan
(74) *Attorney, Agent, or Firm* — Oblon, Spivak, McClelland, Maier & Neustadt, L.L.P.

(57) ABSTRACT

A method for manufacturing a substrate with a metal film includes preparing an insulative substrate having the first surface and the second surface on the opposite side of the first surface, forming in the insulative substrate a penetrating hole having the inner wall tapering from the first surface of the insulative substrate toward the second surface, forming a layer of a composition containing a polymerization initiator and a polymerizable compound on the inner wall of the penetrating hole, irradiating the layer of the composition with energy such that a polymer is formed on the inner wall of the penetrating hole, applying a plating catalyst on the polymer, and forming a plated-metal film on the inner wall of the penetrating hole.

21 Claims, 25 Drawing Sheets

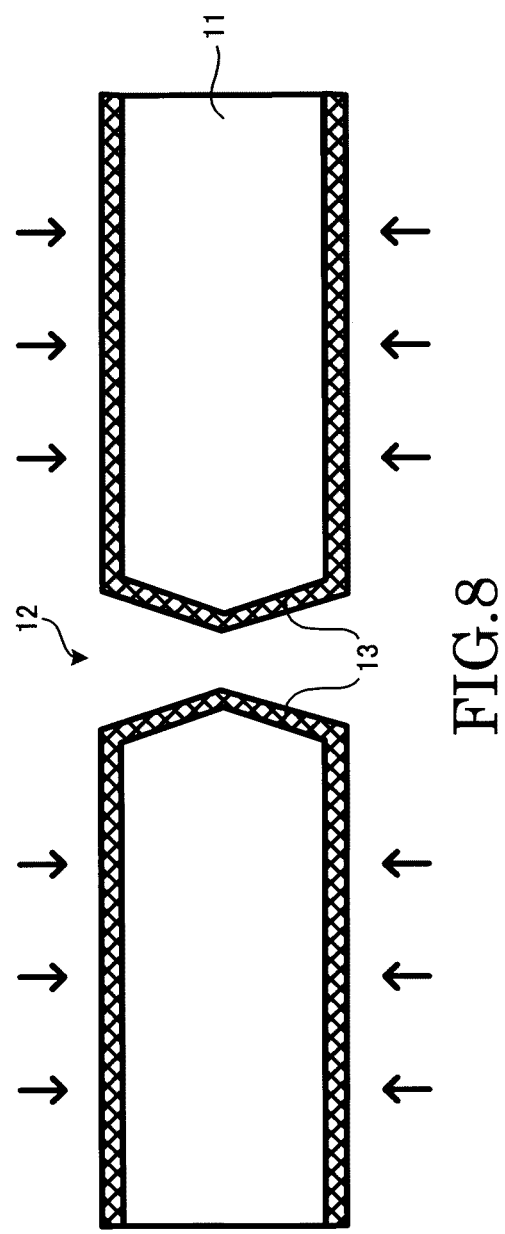

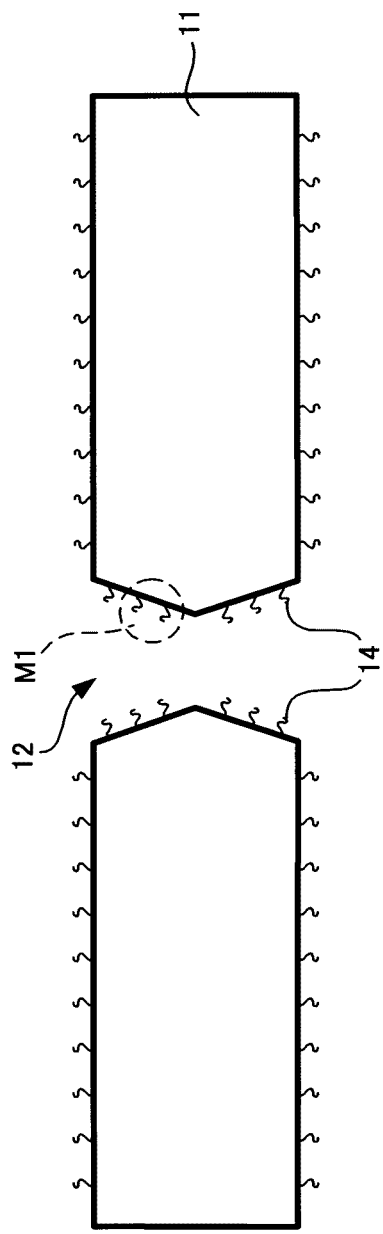

METHOD FOR MANUFACTURING SUBSTRATE WITH METAL FILM

CROSS-REFERENCE TO RELATED APPLICATIONS

The present application claims the benefits of priority to U.S. Application No. 61/165,308, filed Mar. 31, 2009. The contents of that application are incorporated herein by reference in their entirety.

BACKGROUND OF THE INVENTION

1. Field of the Invention

The present invention is related to a substrate with a metal film to be used in a printed wiring board, for example, and its manufacturing method.

2. Discussion of the Background

A printed wiring board generally has wiring made of copper, for example, and formed on a surface of an insulative substrate made of epoxy resin or polyimide resin, for example. To form copper wiring on an insulative substrate, it is suggested that a polymer be formed on the insulative substrate. For example, International Publication No. WO/2007/116057 A2 describes a method which includes the following: on a substrate, forming a polymer that is made up of carboxylic groups and adsorbs ions of a second metal; reducing the ions of the second metal to form the second metal; and depositing a first metal onto the second metal. In International Publication No. WO/2007/116057 A2 to advance polymerization reactions, a substrate is irradiated with UV rays. The contents of this publication are incorporated herein by reference in their entirety.

SUMMARY OF THE INVENTION

According to one aspect of the present invention, a method for manufacturing a substrate with a metal film includes preparing an insulative substrate having the first surface and the second surface on the opposite side of the first surface, forming in the insulative substrate a penetrating hole having the inner wall tapering from the first surface of the insulative substrate toward the second surface, forming a layer of a composition containing a polymerization initiator and a polymerizable compound on the inner wall of the penetrating hole, irradiating the layer of the composition with energy such that a polymer is formed on the inner wall of the penetrating hole, applying a plating catalyst on the polymer, and forming a plated-metal film on the inner wall of the penetrating hole.

According to another aspect of the present invention, a method for manufacturing a substrate with a metal film includes preparing an insulative substrate having the first surface and the second surface on the opposite side of the first surface, forming in the insulative substrate the first opening having the inner wall tapering from the first surface of the insulative substrate toward the second surface, forming in the insulative substrate the second opening having the inner wall tapering from the second surface of the insulative substrate toward the first surface such that a penetrating hole made of the first opening and the second opening is formed in the insulative substrate, forming on the inner walls of the penetrating hole a layer of a composition containing a polymerization initiator and a polymerizable compound, irradiating the layer of the composition with energy such that a polymer is formed on the inner walls of the penetrating hole, applying a plating catalyst on the polymer, and forming a plated-metal film on the inner walls of the penetrating hole.

According to yet another aspect of the present invention, a method for manufacturing a substrate with a metal film includes preparing an insulative substrate having the first surface and the second surface on the opposite side of the first surface, forming in the insulative substrate a penetrating hole having the inner wall tapering from the first surface of the insulative substrate toward the second surface, treating the first surface of the insulative substrate, the second surface of the insulative substrate and the inner wall of the penetrating hole with a surface modification treatment, forming a layer of a composition containing a polymerizable compound on the first surface of the insulative substrate, the second surface of the insulative substrate and the inner wall of the penetrating hole such that a polymer is formed on the first surface of the insulative substrate, the second surface of the insulative substrate and the inner wall of the penetrating hole, applying a plating catalyst on the polymer, and forming a plated-metal film on the inner wall of the penetrating hole.

According to still another aspect of the present invention, a method for manufacturing a substrate with a metal film includes preparing an insulative substrate having the first surface and the second surface on the opposite side of the first surface, forming in the insulative substrate the first opening having the inner wall tapering from the first surface of the insulative substrate toward the second surface, forming in the insulative substrate the second opening having the inner wall tapering from the second surface of the insulative substrate toward the first surface such that a penetrating hole made of the first opening and the second opening is formed in the insulative substrate, treating the first surface of the insulative substrate, the second surface of the insulative substrate and the inner walls of the penetrating hole with a surface modification treatment, forming a layer of a composition containing a polymerizable compound on the first surface of the insulative substrate, the second surface of the insulative substrate and the inner walls of the penetrating hole such that a polymer is formed on the first surface of the insulative substrate, the second surface of the insulative substrate and the inner walls of the penetrating hole, applying a plating catalyst on the polymer, and forming a plated-metal film on the inner wall of the penetrating hole.

According to still another aspect of the present invention, a substrate with a metal film has an insulative substrate having the first surface and the second surface on the opposite side of the first surface, the insulative substrate having a penetrating hole having the inner wall tapering from the first surface toward the second surface, a polymer formed on the inner wall of the penetrating hole and having a functional group bondable with a catalyst for depositing a plated-metal film, and a plated-metal film formed on the inner wall of the penetrating hole.

According to still another aspect of the present invention, a substrate with a metal film has an insulative substrate having the first surface and the second surface on the opposite side of the first surface, the insulative substrate having a penetrating hole made of the first opening having the inner wall tapering from the first surface toward the second surface and the second opening having the inner wall tapering from the second surface toward the first surface, a polymer formed on the inner walls of the penetrating hole and having a functional group bondable with a catalyst for depositing a plated-metal film, and a plated-metal film formed on the inner walls of the penetrating hole.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8 is a view illustrating a step to irradiate the composition with energy;

FIG. 11 is a view showing the insulative substrate where a graft polymer is produced;

DETAILED DESCRIPTION OF THE EMBODIMENTS

Figure 1A:
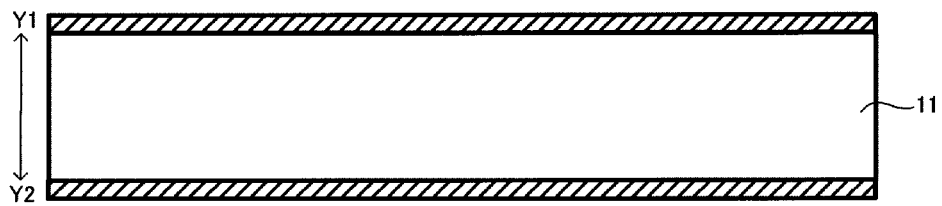
FIG. 1A is a view showing an insulative substrate to be used for manufacturing a substrate with a metal film according to the First Embodiment of the present invention.

The embodiments will now be described with reference to the accompanying drawings, wherein like reference numerals designate corresponding or identical elements throughout the various drawings.

First Embodiment

A substrate with a metal film according to the first embodiment is manufactured through the following steps.

First, as shown in FIG. 1A, insulative substrate 11 is prepared. Insulative substrate 11 has a first surface (the surface on the arrow-Y1 side) and a second surface opposite the first surface (the surface on the arrow-Y2 side) as its upper and lower surfaces. Insulative substrate 11 is made with, for example, glass-epoxy resin with an approximate thickness of 50-600 μm.

The thickness of insulative substrate 11 is preferred to be set in the range of 100-400 μm. If the thickness of insulative substrate 11 is in such a range, the strength of insulative substrate 11 may be ensured. Furthermore, it is easier to form penetrating holes with tapered inner walls.

The first and second surfaces of insulative substrate 11 of the present embodiment are preferred to be smooth, without having uneven surfaces that are transferred from a matte surface of copper foil. However, if the roughness of the first and second surfaces is 0.25 μm (Ra) or less, the first and second surfaces are defined as smooth in the present embodiment. Fine conductive circuits may be formed and high-speed signals (such as signals of 3 GHz or faster) may be transmitted. Moreover, the roughness of the first and second surfaces is preferred to be set in the range of 0.05-0.2 μm (Ra), for example. If the roughness is in such a range, adhesiveness may be enhanced between insulative substrate 11 and a polymer on insulative substrate 11. Also, the thickness of the polymer (polymer layer) may be made thinner.

Also, the surfaces of insulative substrate 11 contain a functional group such as carboxy-alkyl group ($-(CH_2)_n COOH$). The functional group of insulative substrate 11 chemically bonds with an interaction group (functional group that interacts with metal ions or the like) of the polymer compound directly or by means of a backbone polymer compound. As the material for substrate 11, the following may be used: epoxy resin, polyimide resin, polyimide-amide resin, liquid-crystalline polymer, polyetherimide resin, polyether ether ketone resin, aramid resin, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal.

Other than the above insulative material, a fiber-reinforced substrate made with a core material and resin may be used for insulative substrate 11. As a core material, glass cloth, glass non-woven fabric or aramid non-woven fabric may be used. Among those, a sheet-type core material of glass cloth is preferred from the viewpoint of strength, and the thickness of the core material is preferably in the range of 0.09-0.15 mm. As for resins, thermosetting epoxy resin or bismaleimide triazine resin may be used. Among the above-described insulative materials and resins, epoxy resin is preferred because of its adhesiveness with polymer layers.

Insulative substrate 11 with smooth first and second surfaces may be obtained by sandwiching a semi-cured insulative material or fiber-reinforced substrate with smooth pressing boards and by thermopressing such a material.

In the present embodiment, a glass-epoxy substrate with a thickness of 400 μm is used as a starting material. The roughness of the first and second surfaces is 0.1-0.2 μm (Ra), for example. "Ra" indicates arithmetic average roughness, a parameter defined by the Japanese Industrial Standards (JIS).

Figure 1B:
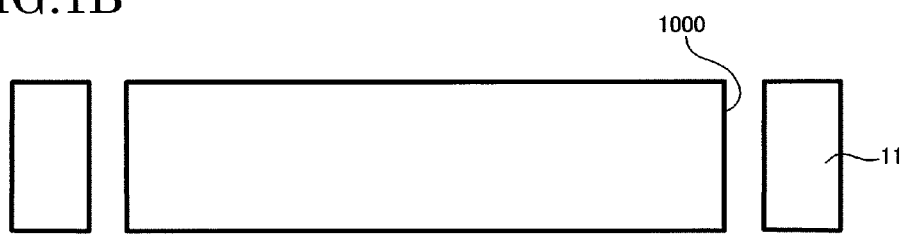
FIG. 1B is a view illustrating a step to form an alignment mark in the insulative substrate.

Next, as shown in FIG. 1B, alignment marks 1000 are formed in insulative substrate 11. Alignment marks 1000 are preferred to be such holes that penetrate insulative substrate 11. Also, alignment marks 1000 are preferred to be positioned at the four corners of the substrate.

Figure 1C:
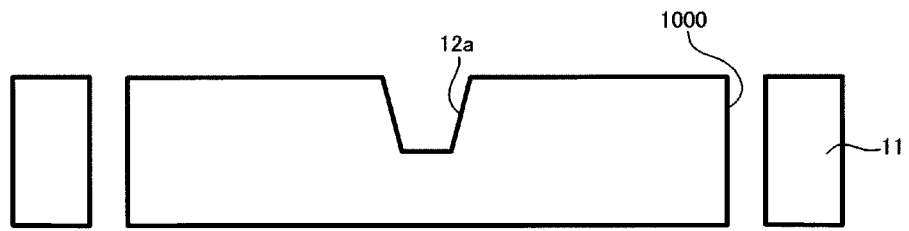
FIG. 1C is a view illustrating a step to form a first opening on the first surface of the insulative substrate.

As shown in FIG. 1C, for example, based on alignment marks 1000, a $CO_2$ laser or UV laser, for example, is irradiated onto the first surface of insulative substrate 11. The type of laser to irradiate insulative substrate 11 and the irradiation method are preferred to be as follows.

Figure 2A:
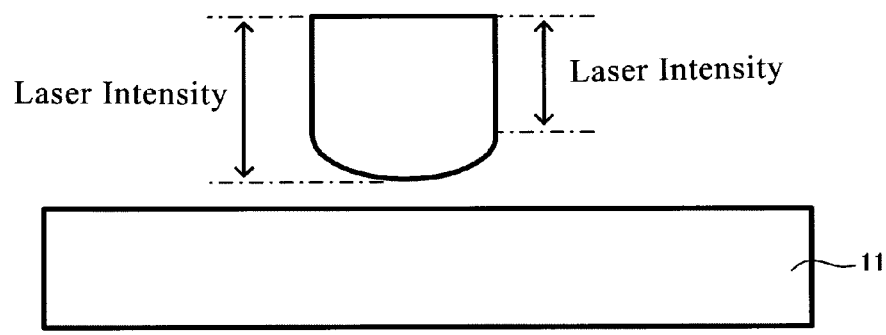
FIG. 2A is a schematic illustration showing an example of a laser used to form an opening.
Figure 2B:
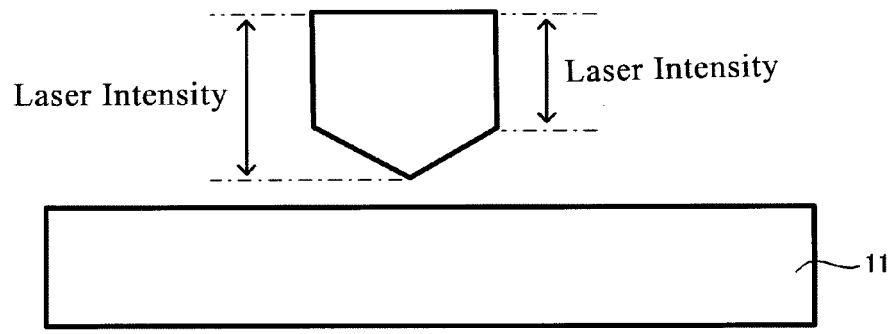
FIG. 2B is a schematic illustration showing another example of a laser used to form an opening.

(1) Insulative substrate 11 is irradiated by a laser having energy density higher in the center than on the periphery. FIGS. 2A, 2B are schematic views showing such lasers. FIG. 2A is a view schematically showing a laser having energy density that decreases from the center exponentially toward the periphery; and FIG. 2B is a view schematically showing another laser having energy density that decreases in a straight line from the center toward the periphery.

(2) By irradiating insulative substrate 11 with laser beams having multiple pulses, one first opening (12a), one second opening (12b) (FIG. 4) and penetrating hole 12 (FIG. 4) may be formed. In such a case, the diameter of the final laser pulse may be set smaller than the diameter of the first laser pulse. The laser diameters may be reduced gradually from the first pulse to the final pulse. A laser having higher energy density in the center than on the periphery may be used for the final pulse.

In the method in step (1), to form one first opening (12a), one second opening (12b) and penetrating hole 12, the laser beams may be irradiated once or multiple times. In order to control the depth of first opening (12a) and second opening (12b), and to determine the configurations of first opening (12a), second opening (12b) and penetrating hole 12, the number of laser irradiations is preferred to be multiple.

By using the above-described laser and processing method, the openings formed in insulative substrate 11 may be formed to be tapered.

Figure 3A:
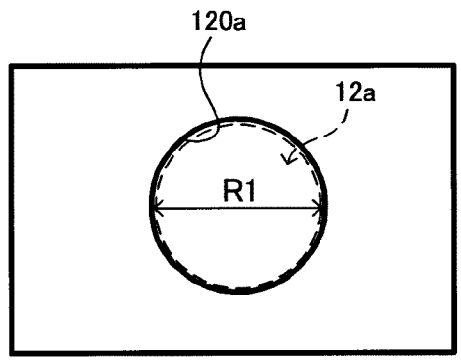
FIG. 3A is a plan view of an example showing a shape of the first opening.
Figure 3B:
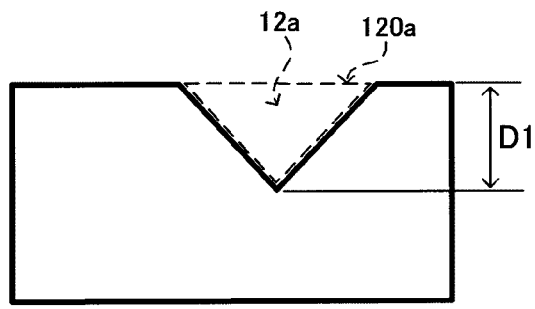
FIG. 3B is a view of an example showing a cross-sectional shape of the first opening.
Figure 3C:
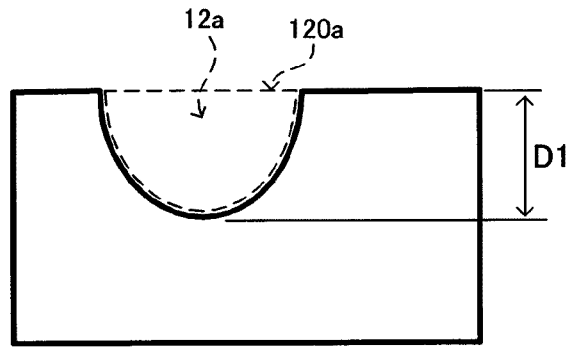
FIG. 3C is a view of another example showing a cross-sectional shape of the first opening.

As shown in FIG. 1C, first opening (12a) (hole), whose inner wall tapers from the first surface of insulative substrate 11 toward the second surface, is formed in one side (first surface) of insulative substrate 11. Tapering from the first surface toward the second surface includes cases in which first opening (12a) becomes gradually narrower from the first surface toward the second surface. FIGS. 3A-3C show such examples.

FIG. 3A is a plan view of first opening (12a) seen from the first-surface side of insulative substrate 11. As shown in FIG. 3A, first opening (12a) has first opening portion (120a) on the first surface of insulative substrate 11. The diameter of first opening portion (120a) is (R1). When first opening portion (120a) is elliptic, (R1) is the major axis.

FIGS. 3B and 3C are views showing cross sections of first opening (12a) obtained by carving first opening (12a) with a plane which passes through the gravity center of first opening portion (120a) and is perpendicular to the first surface of insulative substrate 11. The depth of first opening (12a) is (D1). FIG. 3B shows an example in which the diameter of the inner wall of first opening (12a) (hole) decreases in a straight line from the first surface toward the second surface; and FIG. 3C shows an example in which the diameter of the inner wall of first opening (12a) (hole) decreases exponentially from the first surface toward the second surface.

In the present embodiment, insulative substrate 11 is irradiated with three pulses of $CO_2$ laser from the first surface of the substrate to form first opening (12a). The diameter of the first pulse is 120 μm, the diameter of the second pulse is 100 μm and the diameter of the third pulse is 80 μm. The laser energy is greater in the center than on the periphery in the first pulse, the second pulse and the third pulse. The diameter of a laser may be changed, for example, by adjusting the diameter of a mask in laser processing equipment. Accordingly, first opening (12a) with (R1) of 120 μm and (D1) of 230 μm is formed on the first-surface side of insulative substrate 11.

Figure 4:
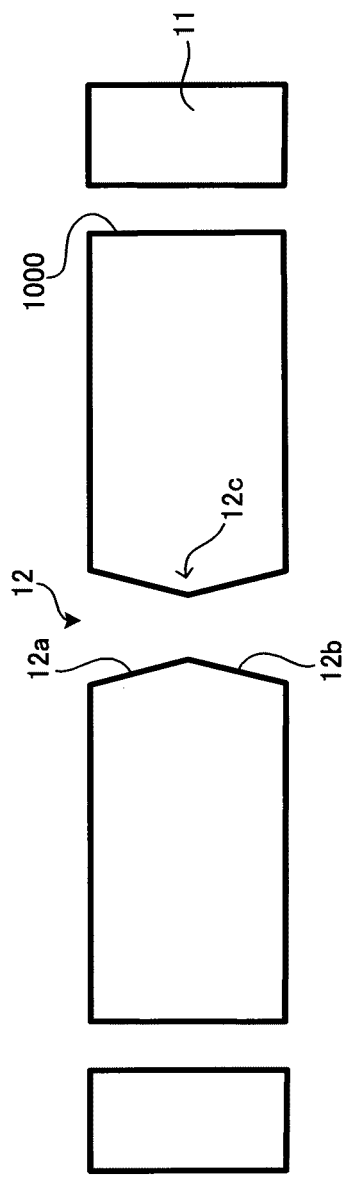
FIG. 4 is a view illustrating a step to form a second opening on the second surface of the insulative substrate.

Next, as shown in FIG. 4, for example, after predetermined preliminary processing, the second surface of insulative substrate 11 is irradiated by $CO_2$ laser, for example. In doing so, second opening (12b) (hole) is formed in one side (second surface) of insulative substrate 11. Accordingly, penetrating hole 12 made up of first opening (12a) and second opening (12b) is formed in insulative substrate 11. The position on which to irradiate a laser is opposite first opening (12a) (hole), and is determined based on alignment marks 1000. First opening (12a) and second opening (12b) are formed using the same alignment marks 1000. Thus, it is easier to form penetrating hole 12 made up of first opening (12a) and second opening (12b).

The inner wall of second opening (12b) (hole), symmetrical to first opening (12a) (hole), tapers from the second surface of insulative substrate 11 toward the first surface. Second opening (12b) may be formed using the laser and the method described in the above (1) and (2).

Figure 5A:
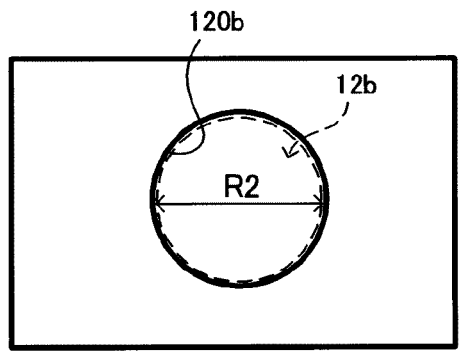
FIG. 5A is a plan view of an example showing a shape of the second opening.
Figure 5B:
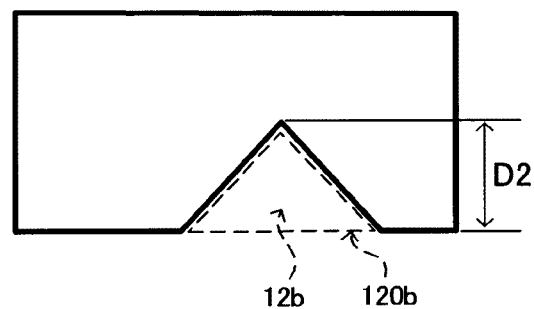
FIG. 5B is a view of an example showing a cross-sectional shape of the second opening.

Tapering from the second surface toward the first surface includes cases in which second opening (12b) becomes gradually narrower from the second surface toward the first surface. FIGS. 5A-5B show such examples.

FIG. 5A is a plan view of second opening (12b) seen from the second-surface side of insulative substrate 11. As shown in FIG. 5A, second opening (12b) has second opening portion (120b) on the second surface of insulative substrate 11. The diameter of second opening portion (120b) is (R2). When second opening portion (120b) is elliptic, (R2) is the major axis.

Figure 5C:
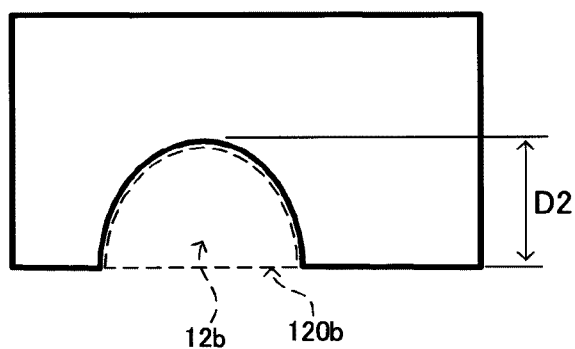
FIG. 5C is a view of another example showing a cross-sectional shape of the second opening.

FIGS. 5B and 5C are views showing cross sections of second opening (12b) obtained by carving second opening (12b) with a plane that passes through the gravity center of second opening portion (120b) and is perpendicular to the first surface of insulative substrate 11. The depth of second opening (12b) is (D2). FIG. 5B shows an example in which the diameter of the inner wall of second opening (12b) (hole) decreases in a straight line from the second surface toward the first surface; and FIG. 5C shows an example in which the diameter of the inner wall of second opening (12b) (hole) decreases exponentially from the second surface toward the first surface.

In the present embodiment, insulative substrate 11 is irradiated with three pulses of $CO_2$ laser from the second surface of the substrate to form second opening (12b). The diameter of the first pulse is 120 μm, the diameter of the second pulse is 100 μm and the diameter of the third pulse is 80 μm. The laser energy is greater in the center than on the periphery in the first pulse, the second pulse and the third pulse. The diameter of a laser may be changed, for example, by adjusting the diameter of a mask in laser processing equipment. Accordingly, second opening (12b) where (R2) is 120 μm and (D2) is 230 μm is formed on the second-surface side of insulative substrate 11.

Figure 6:
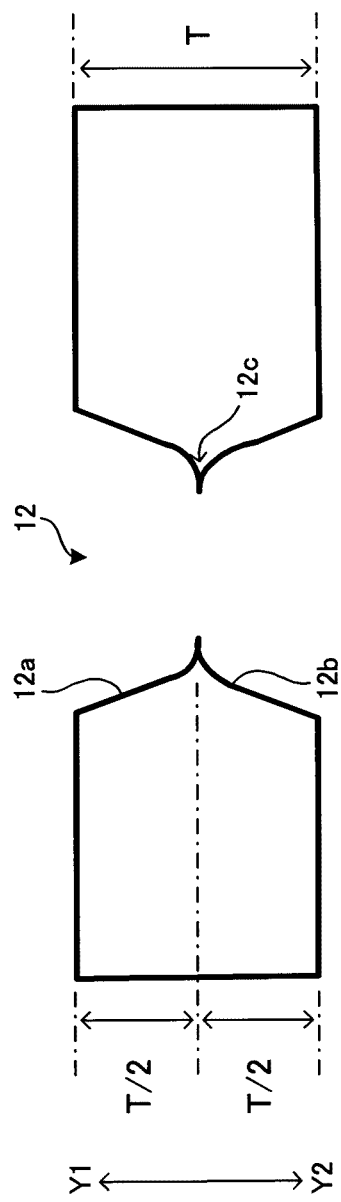
FIG. 6 is a cross-sectional view of an example showing the shape of a penetrating hole.

Accordingly, insulative substrate 11 is penetrated. First opening (12a) and second opening (12b) are joined, and as shown in FIG. 6, hourglass-shaped penetrating hole 12 is formed, having neck portion (12c) (the surface with the smallest diameter) at the midpoint (positioned at half the thickness (T)) of insulative substrate 11 with thickness (T). The inner walls of penetrating hole 12 taper toward the center of penetrating hole 12 from the first surface toward the second surface or from the second surface toward the first surface. First opening (12a) and second opening (12b) of penetrating hole 12 are formed substantially symmetrical with neck portion (12c) as the line of symmetry. Neck portion (12c) is equidistant from the first surface and the second surface. The openings (the shape of first opening (12a) and second opening (12b)) of penetrating hole 12 are shaped to be circular, for example. However, any other shape may be employed for the openings; for example, polygons such as tetragons, hexagons or octagons may also be used.

By using a laser shown in FIG. 2B to form first opening (12a) and second opening (12b), penetrating hole 12 may be shaped such as that shown in FIG. 4.

Figure 7:
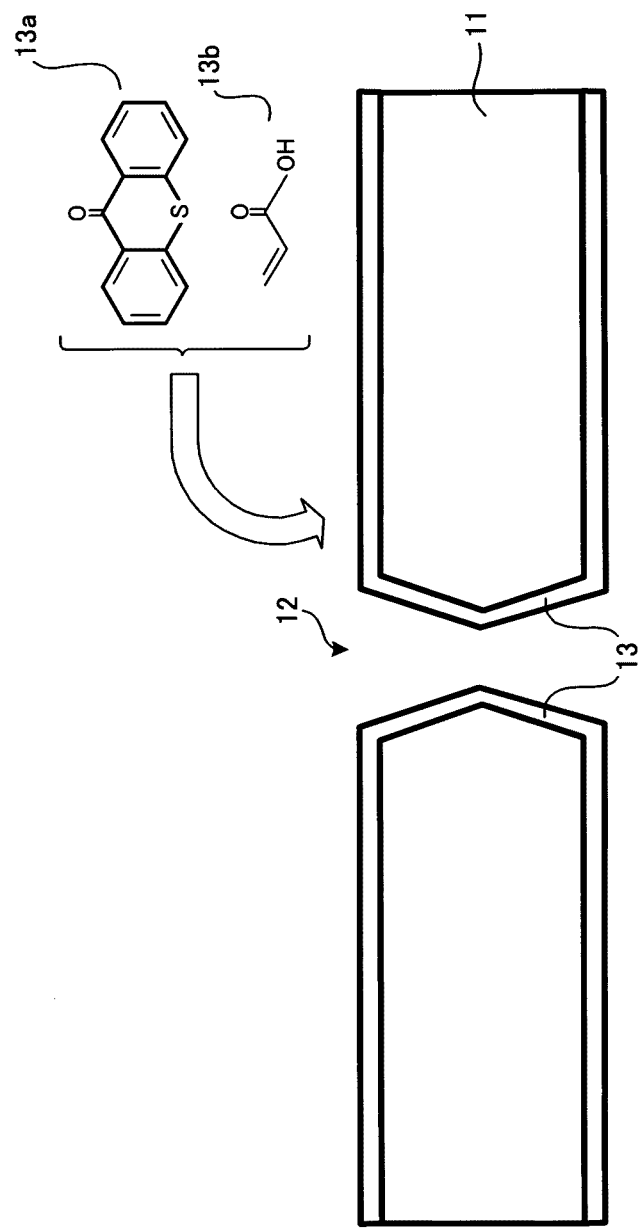
FIG. 7 is a view illustrating a step to apply a composition on the surfaces of the insulative substrate including the inner walls of the penetrating hole.

Next, desmearing (removing smears) is conducted. After that, plasma treatment, corona treatment or the like may be conducted for modifications of the surfaces (first and second surfaces) of insulative substrate 11 and the wall surfaces of first opening (12a) and second opening (12b) according to requirements. Polymerization initiator (13a) and polymerizable compound (13b) shown in FIG. 7 are dissolved in an appropriate solvent. Then, composition 13 containing polymerization initiator (13a) and polymerizable compound (13b) is formed on the surfaces of insulative substrate 11 including the inner walls of penetrating hole 12. To form composition 13 on the surfaces of the substrate, for example, the substrate with penetrating hole 12 may be immersed in a solution containing composition 13. Alternatively, composition 13 may be sprayed on the substrate; or composition 13 may be coated on the substrate.

Polymerization initiator (13a) is made from, for example, radical polymerization initiator 2-methyl-[4-(methylthio) phenyl]-2-morpholino-1-propanone. Polymerization initiator (13a) initiates polymerization in polymerizable compound (13b) when irradiated with energy such as UV (ultraviolet light). Polymerizable compound (13b) is made from, for example, an acrylic acid monomer containing a terminal carboxyl group (—COOH). Polymerizable compound (13b) chemically bonds with insulative substrate 11 through carboxyl groups as interaction groups. Also, when composition 13 is irradiated with energy, polymerizable compound (13b) is activated by polymerization initiator (13a) and becomes a graft polymer. Depending on the graft polymer to be produced, the type (ingredients, concentration and so forth) of polymerizable compound (13b) may be selected accordingly. The solvent for composition 13 is the type of solution that dissolves polymerization initiator (13a) and polymerizable compound (13b). Solvents having a boiling point not too high, for example, approximately at 40-150° C. are preferred, since it is easier to dry such solvents.

Polymerization initiator (13a), polymerizable compound (13b) and the solvent are not limited specifically, and any type may be used.

Polymerization initiator (13a) may be selected from among the following: acetophenones, ketones, benzoin ethers or benzyl ketals. As for acetophenones, for example, the following are effective: p-tert-butyl trichloro acetophenone, 2,2'-diethoxyacetophenone or 2-hydroxy-2-methyl-1-phenylpropane-1-one. As for ketones, for example, the following are effective: benzophenone (4,4'-bis dimethylamino_benzophenone, 2-chloro thioxanthone, 2-methyl thioxanthone, 2-ethyl thioxanthone or 2-isopropyl thioxanthone. As for benzoin ethers, for example, the following are effective: benzoin, benzoin methyl ether, benzoin isopropyl ether or benzoin isobutyl ether. As for benzyl ketals, the following are effective: benzyl dimethyl ketal or hydroxycyclohexyl phenyl ketone.

Polymerization initiator (13a) is not limited to radical polymerization initiators; for example, initiators of anionic polymerization or cationic polymerization may also be used. Moreover, as for polymerization initiator (13a), listed above are mainly photopolymerization initiators; however, other than such photopolymerization initiators, thermal polymerization initiators may also be used. As thermal polymerization initiators, azo initiators, peroxides or the like may be listed. As for azo initiators, they are not limited specifically, and the following may be used: 2,2'-azobis(isobutyronitrile), 2,2'-azobis(isobutylate), 2,2'-azobis-2-methyl butyronitrile or the like. As for peroxides, they are not limited specifically, and the following may be used: benzoyl peroxide, acetyl peroxide, lauroyl peroxide or the like.

Polymerizable compound (13b) may be any of the following monomers or any combination of such: itaconic acid, 2-hydroxyethyl acrylate, acrylamide, N-monomethylol acrylamide, N-dimethylol acrylamide, allylamine, 3-vinyl propionate, vinyl sulfonic acid, 2-sulfoethyl acrylate, polyoxyethylene glycol monoacrylate, 2-acrylamido-2-methylpropane sulfonate, acid phosphoxy polyoxyethylene glycol monoacrylate or N-vinylpyrrolidone.

Polymerizable compound (13b) is not limited to monomers; for example, hydrophobic polymers having polymerizable groups in their molecules may be used. As for hydrophobic polymers, for example, the following may be effective: diene homopolymers such as polybutadiene; homopolymers containing allyl groups such as allyl acrylate; bidimensional or multidimensional copolymers such as styrene containing diene monomers; linear polymers or tridimensional polymers having carbon-carbon double bonds such as unsaturated polyester, high-density polyethylene or the like.

As for interaction groups of polymerizable compound (13b), other than carboxyl groups, functional groups such as following may also be used: sulfonate groups, phosphate groups, amino groups, hydroxyl groups, amide groups, phosphine groups, imidazole groups, pyridine groups or ether groups.

As for solvents, any of the following or any combination of such is effective: acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxy propanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate or 3-methoxy propyl acetate.

Next, by conducting a heat treatment, such solvents are dried and removed. Also, the substrate is exposed to light to preliminarily cure the composition according to requirements.

Then, as shown in FIG. 8, using a UV lamp, for example, UV (ultraviolet rays) are irradiated onto both surfaces (first surface and second surface) of insulative substrate 11 from both directions, namely, from the first surface as well as from the second surface of insulative substrate 11. In the first embodiment, penetrating hole 12 is configured in such a way that its inner walls are tapered to incline inward from one surface, either the first surface or the second surface, to the other surface (see FIGS. 4 and 6). Thus, UV rays are beamed to the entire inner walls of penetrating hole 12.

Figure 9A:
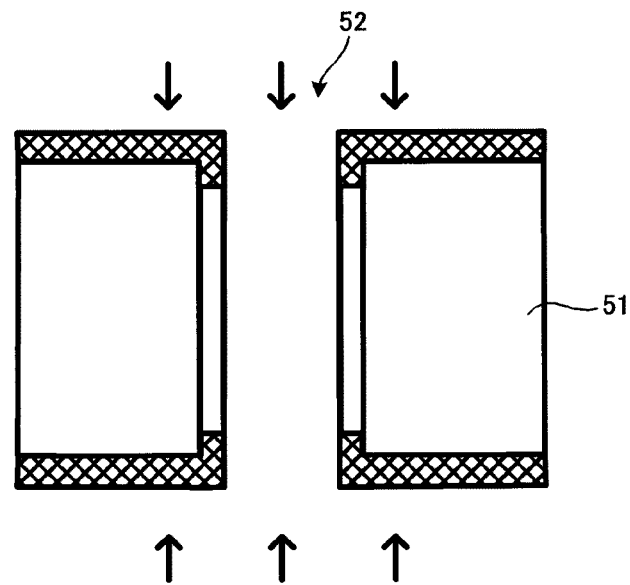
FIG. 9A is a view showing the portions exposed to energy when irradiating energy onto a penetrating hole of a Comparative Example.
Figure 9B:
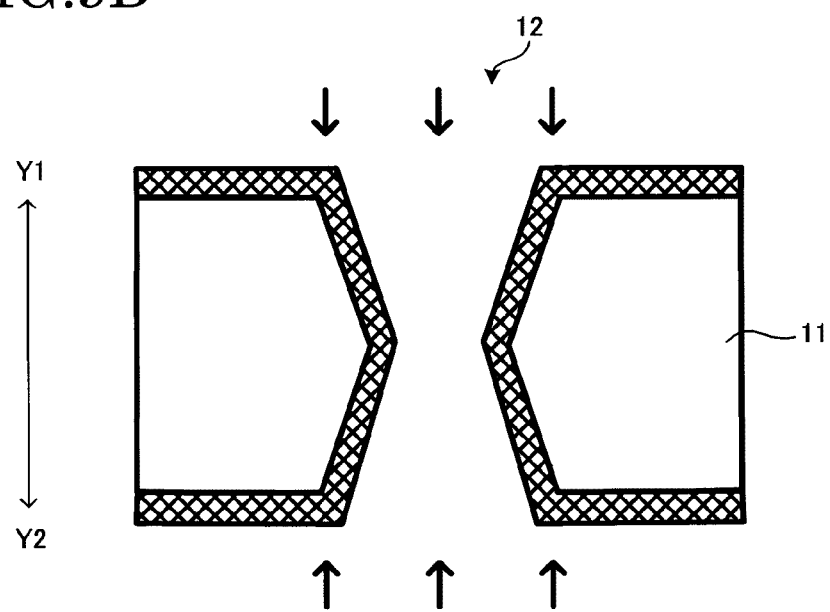
FIG. 9B is a view showing the portions exposed to energy when irradiating energy onto a penetrating hole of the present embodiment.

For example, as shown in FIG. 9A, the inner wall of penetrating hole 52 (Comparative Example) is perpendicular to each surface of insulative substrate 51. Thus, the inner-wall surface corresponds to the direction of the UV rays. Accordingly, the UV rays seldom irradiate parts of the inner wall, specifically portions away from each surface of insulative substrate 51. By contrast, as shown in FIG. 9B, the inner-wall surfaces of penetrating hole 12 of the present embodiment do not correspond to the direction of the UV rays, but have predetermined angles from the first surface to the second surface. Therefore, substantially uniform UV rays may be irradiated on the entire inner walls of penetrating hole 12.

Energy irradiation is not limited to using UV rays. For example, other energy irradiation such as electron beams, X-rays, ion beams, far infrared rays, g-rays, i-rays, deep UV rays or high-density energy beams (laser beams) may also be used. Also, any energy source may be used; for example, energy sources such as mercury-vapor lamps, metal halide lamps, xenon lamps, chemical lamps or carbon arc lamps.

Figure 10A:
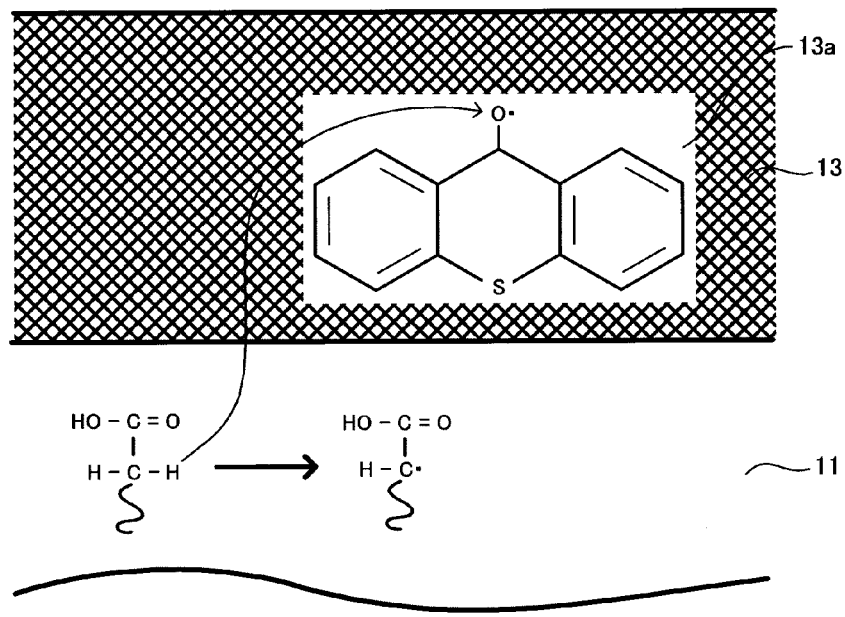
FIG. 10A is a view showing a process in which the surfaces of the insulative substrate are activated when irradiated with energy.
Figure 10B:
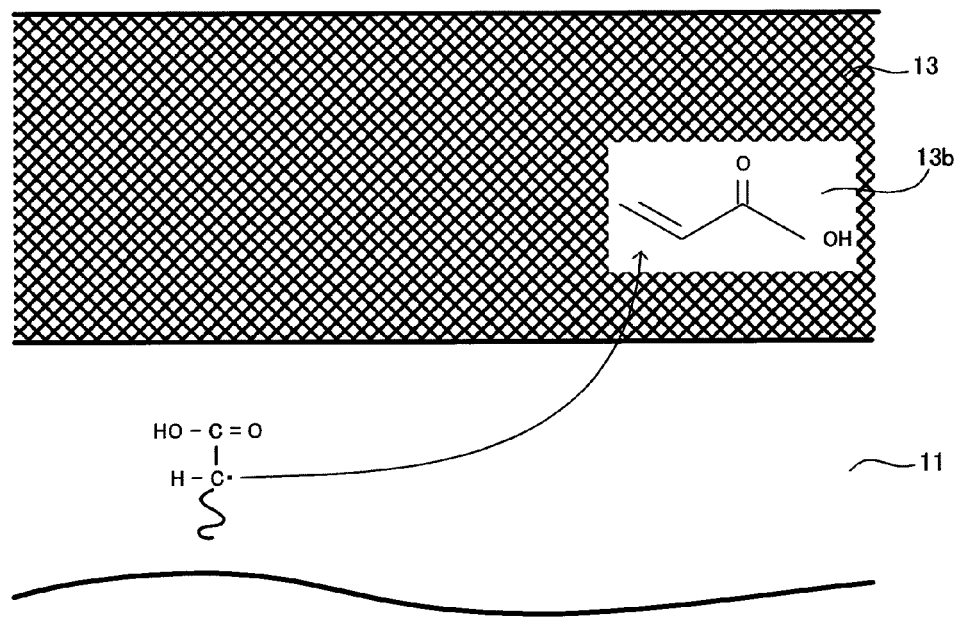
FIG. 10B is a view showing a process in which the insulative substrate is bonded to a polymerizable compound when irradiated with energy.

When composition 13 is irradiated with energy (UV), a radical (active species) is produced as shown in FIG. 10A, for example. Then, by activated polymerization initiator (13a), hydrogen is removed from the functional group (—CH$_2$COOH) on the surfaces of insulative substrate 11, and the surfaces of insulative substrate 11 become activated. Then, the activated functional group (—CH.COOH) reacts with the vinyl group (H$_2$C═CH—) of polymerizable compound (13b) (acrylic acid) as shown in FIG. 10B, for example. Insulative substrate 11 and polymerizable compound (13b) chemically bond through the reaction (coupling reaction/polymerization) of carboxy-alkyl group (—CH$_2$COOH) and vinyl group (H$_2$C═CH—). Accordingly, as shown in FIG. 11, for example, graft polymer 14 is produced on the surfaces of insulative substrate 11 including the inner walls of penetrating hole 12. By the reactions described so far, it is thought that graft polymer 14 is produced on the first and second surfaces of insulative substrate 11 and the inner walls of penetrating hole 12. Graft polymer 14 may also be referred to as a polymer or a polymer layer.

Figure 12A:
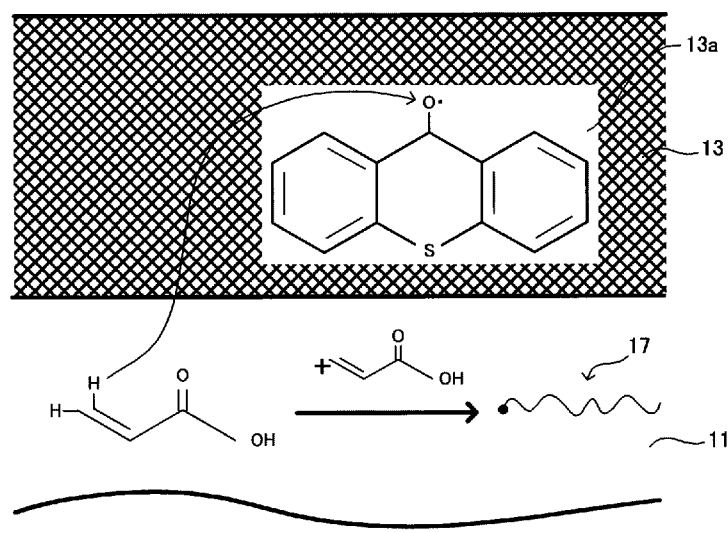
FIG. 12A is a view of a first example showing a mechanism of how a graft polymer is produced.
Figure 12B:
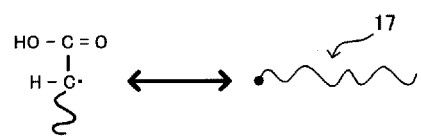
FIG. 12B is another view of the first example showing a mechanism of how a graft polymer is produced.

The mechanism to produce graft polymer 14 may also be considered as follows: As shown in FIG. 12A, hydrogen is removed from polymerizable compound (13b) by activated polymerization initiator (13a), and polymerizable compound (13b) repeats the polymerization reaction within itself to produce polymer 17; as a result, as shown in FIG. 12B, the activated functional group (—CH.COOH) and polymer 17 bond to produce graft polymer 14 on the first and second surfaces of insulative substrate 11 and the inner walls of penetrating hole 12.

In coupling reactions, the following combinations are effective: (—COOH) with amines, (—COOH) with aziridines, (—COOH) with isocyanates, (—COOH) with epoxies, (—NH$_2$) with isocyanates, (—NH$_2$) with aldehydes, (—OH) with alcohols, (—OH) with halogen compounds, (—OH) with amines, (—OH) with acid anhydrides, or the like. Therefore, it is preferred that insulative substrate 11 and polymerizable compound (13b) each contain a functional group, and that the functional group of insulative substrate 11 and the functional group of polymerizable compound (13b) satisfy the above combinations.

Figure 13:
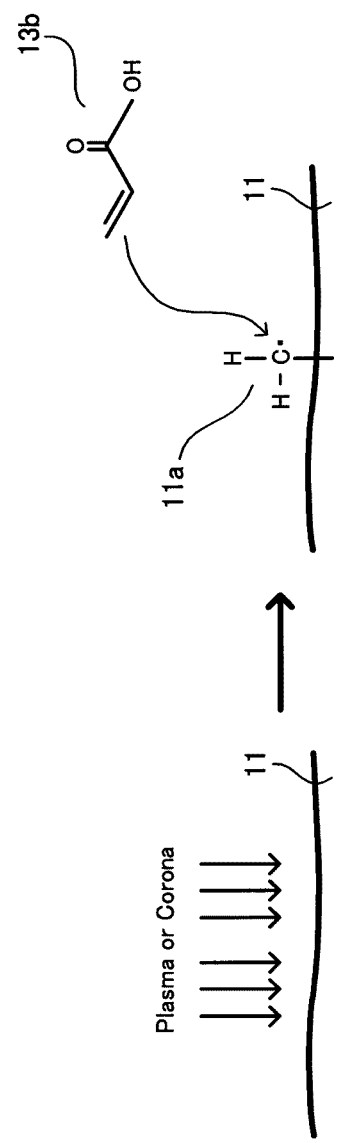
FIG. 13 is a view of a second example showing a mechanism of how a graft polymer is produced.

Also, as shown in FIG. 13, when surface modifications such as a plasma treatment or corona treatment are conducted after desmearing, it is thought that radical (11a) is produced on the surfaces of insulative substrate 11. Then, it is thought that radical (11a) reacts with polymerizable compound (13b) to produce graft polymer 14 on the first and second surfaces of insulative substrate 11 and inner walls of penetrating hole 12 (FIG. 11). In such a case, composition 13 (FIG. 7) is made from polymerizable compound (13b). Composition 13 is not always required to contain polymerization initiator (13a).

In the following, a catalyst (catalyst to initiate electroless plating) is applied so that an electroless plated-metal film is deposited on the first and second surfaces of insulative substrate 11 and on the inner walls of penetrating hole 12. The catalyst is attached to the first and second surfaces of the substrate and the inner walls of penetrating hole 12 by means of the graft polymer. Applying a catalyst on the surfaces of insulative substrate 11 includes applying metal ions that function as a catalyst and applying a compound containing metal that functions as a catalyst. As for a compound containing metal that functions as a catalyst, metal salts, complexes, complex ions or colloids may be listed. More specifically, by immersing the surfaces of insulative substrate 11 including the inner walls of penetrating hole 12 in a palladium chloride solution (palladium-ion concentration: 0.1 M), palladium ions as metal ions (15a) are applied to graft polymer 14.

Figure 14:
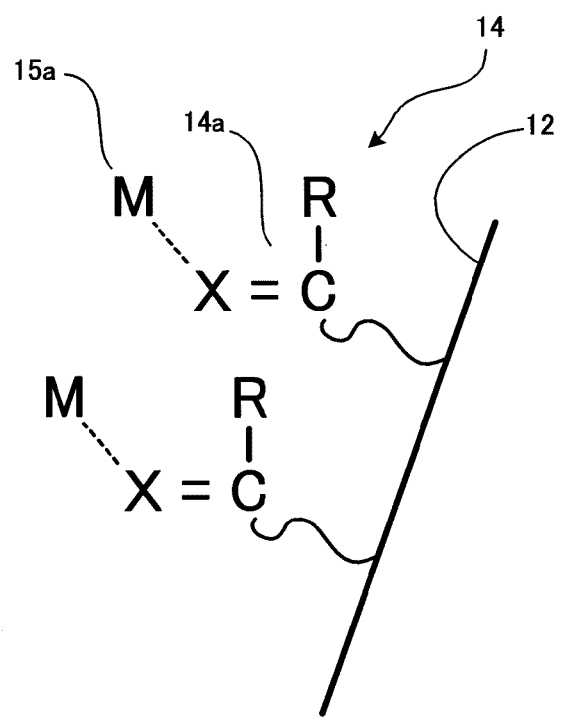
FIG. 14 is a magnified view showing part of FIG. 11.

Graft polymer 14 contains functional group (14a) (—RCX) bondable to metal ion (15a) (and to its metal salt), as shown in FIG. 14 (a magnified view of region (M1) in FIG. 11), for example. Namely, since functional group (14a) has negatively charged lone pairs of electrons, it can adsorb positively charged metal ions (15a). Therefore, by immersing insulative substrate 11, where the polymer is formed on the first and second surfaces of the substrate and the inner walls of penetrating hole 12, metal ions (15a) are adsorbed onto graft polymer 14.

Complex ions, an ionized complex, are adsorbed onto the polymer the same as metal ions (15a). When colloids are charged, they are adsorbed onto the polymer the same as metal ions (15a). Also, metal salts form coordinate bonds with lone pairs of electrons of functional group (14a). Complexes form coordinate bonds with lone pairs of electrons of functional group (14a). If colloids are not charged, they form coordinate bonds with lone pairs of electrons of functional group (14a). It is thought that through the mechanisms described so far, a catalyst, or metal ions (15a) that function as a catalyst, or a compound containing a metal that functions as a catalyst, is adsorbed onto graft polymer 14.

Functional group (14a) and metal ions (15a) are not limited to any specific type. As for functional group (14a), for example, hydrophilic groups such as carboxyl groups, sulfonyl groups or hydroxyl groups are effective. As for metal ions (15a), ions such as palladium, silver, copper, nickel, aluminum, iron, cobalt, gold or chrome are effective.

Also, application of metal ions (15a) is not limited to any specific method. For example, by pulverizing a metal salt into fine particles and applying them directly on the surfaces of insulative substrate 11, metal ions (15a) are adsorbed onto graft polymer 14. Alternatively, by dissolving the metal salt in a solvent and applying it on the surfaces of insulative substrate 11, the metal ions are adsorbed onto graft polymer 14.

Alternatively, instead of metal ions (15a), metal salts, complexes, complex ions or colloids may be adsorbed onto the graft polymer.

Figure 15:
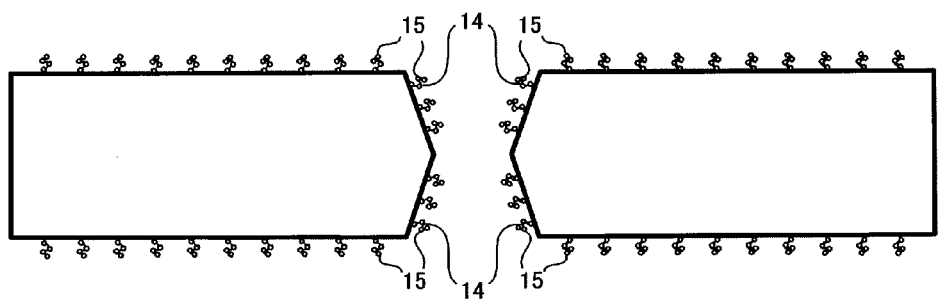
FIG. 15 is a view illustrating a step to form a metal by reducing metal ions.

After that, according to requirements, by washing with water the surfaces of insulative substrate 11 including the inner walls of penetrating hole 12, excess metal ions (15a) are removed. Then, insulative substrate 11 with a catalyst is immersed in a solution containing a reducing agent, for example. As shown in FIG. 15, metal ions (15a) are reduced to metal by the reducing agent, becoming the catalyst to initiate electroless plating. Metal ions (15a) adsorbed onto the surfaces of insulative substrate 11 are reduced to metal 15; and fine metal particles (metal 15) are deposited on the surfaces of insulative substrate 11.

As for reducing agents, at least one kind selected from among the following or its salts is preferred: hydrazines, tartaric acid, boron compounds, aldehydes, hypophosphorous acid, phosphinic acid or phosphorous acid. As for boron compounds, tetrahydro borates such as sodium tetrahydro borate; amine boranes such as trimethylamine borane or dimethylamine borane; or aldehydes such as formalin or acetaldehyde may be listed. In the present embodiment, hypophosphorous acid with a concentration of 1M is used.

When adding a reducing agent, any method may be used. For example, a reduction solution with a predetermined concentration may be applied or dripped directly onto the surfaces of insulative substrate 11.

Figure 16:
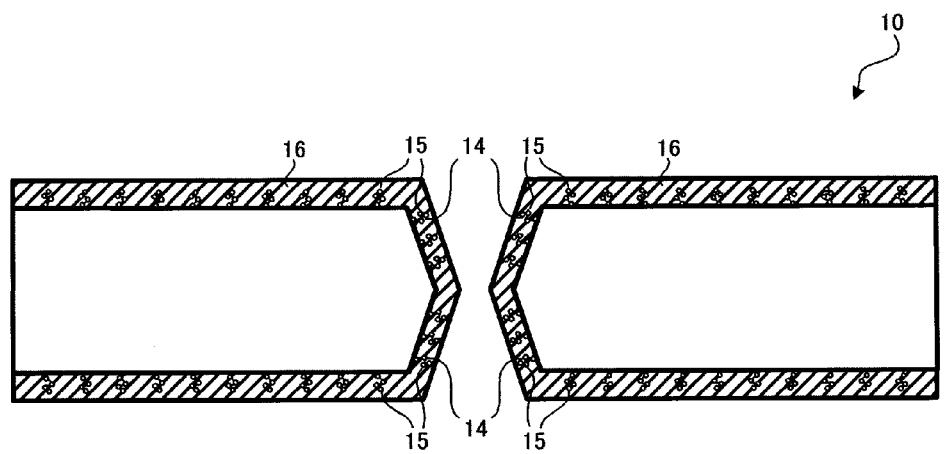
FIG. 16 is a view illustrating a step to form an electroless plated-metal film on the surfaces of the insulative substrate including the inner walls of a penetrating hole.

In the following, as shown in FIG. 16, electroless plated-metal film 16 (metal film) made of copper, for example, is formed on the surfaces of insulative substrate 11 including the inner walls of penetrating hole 12. More specifically, the surfaces of insulative substrate 11 including the inner walls of penetrating hole 12 are immersed in an electroless plating bath at a predetermined temperature for a predetermined time. Such plating will progress using metal 15 as catalyst nuclei. Accordingly, a strong bond (adhesion) is formed between insulative substrate 11 and electroless plated-metal film 16. In the present embodiment, insulative substrate 11 with a catalyst is immersed in an electroless copper plating solution (Thru-Cup) made by C. Uyemura Co., Ltd. to form electroless copper-plated film with a thickness of 0.3-3 μm on the surfaces of insulative substrate 11. Such an electroless plating bath contains, for example, metal ions to be plated, a reducing agent and a stabilizer. However, the electroless plating bath is not limited to such, and any other kind may be used. As for metal ions to be plated, chrome, lead, nickel, gold, silver, tin or zinc may be used other than copper.

Accordingly, substrate 10 with a metal film is completed.

Second Embodiment

Figure 17:
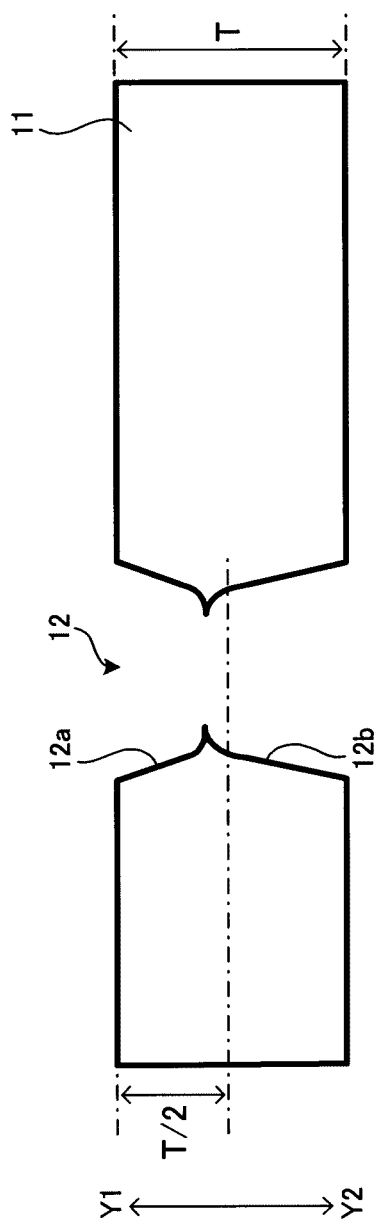
FIG. 17 is a cross-sectional view of an example showing the shape of a penetrating hole of a substrate with a metal film according to the second embodiment of the present invention.

FIG. 17 shows a cross-sectional view of penetrating hole 12 according to the second embodiment. FIG. 17 is a view obtained by carving penetrating hole 12 with a plane which passes through the gravity center of first opening portion (120a) and is perpendicular to the first surface (FIGS. 3A-3C). In the following, a manufacturing method of the second embodiment is described.

The same as in the first embodiment, insulative substrate 11 is prepared. Then, three pulses of $CO_2$ laser are irradiated onto insulative substrate 11 from the first surface of the substrate. In the second embodiment, the laser energy per one pulse is set weaker than that in the first embodiment. The laser energy is greater in the center than on the periphery in the first pulse, the second pulse and the third pulse. The diameter of the first pulse is 120 μm, the diameter of the second pulse is 100 μm and the diameter of the third pulse is 80 μm. Accordingly, first opening (12a) with (R1) of 120 μm and (D1) of 170 μm is formed such as shown in FIGS. 3A-3C. By adjusting the laser energy and number of pulses, (D1) may be modified.

Next, three pulses of laser are irradiated onto the substrate from the second surface. The position to be irradiated is opposite first opening (12a). In the second embodiment, the laser energy per one pulse to form second opening (12b) is greater than the laser energy per one pulse to form first opening (12a). Also, the diameter of the first pulse is 100 μm, the diameter of the second pulse is 90 μm and the diameter of the third pulse is 80 μm. The laser energy is greater in the center than on the periphery in the first, second and third pulses. The laser diameter may be modified, for example, by adjusting a mask of laser processing equipment. Accordingly, second opening (12b) with (R2) of 100 μm and (D2) of 300 μm is formed on the second-surface side of insulative substrate 11 as shown in FIGS. 5A-5C.

Penetrating hole 12 made up of first opening (12a) and second opening (12b) is formed in the substrate (see FIG. 17). In the second embodiment, (R1) is greater than (R2) and (D1) is smaller than (D2). Thus, even if the line passing through the gravity center of first opening portion (120a) (FIGS. 3A-3C) and perpendicular to the first surface does not correspond to the line passing through the gravity center of second opening portion (120b) (FIGS. 5A-5C) and perpendicular to the first surface, penetrating hole 12 made up of first opening (12a) and second opening (12b) may be formed easily. The portion where first opening (12a) and second opening (12b) join each other is positioned between the first surface of insulative substrate 11 and the center (½ of thickness (T)) of the substrate. The through-hole conductor will seldom be damaged from repeated warping of insulative substrate 11.

Applied Example of a Substrate with Metal Film

Figure 18:
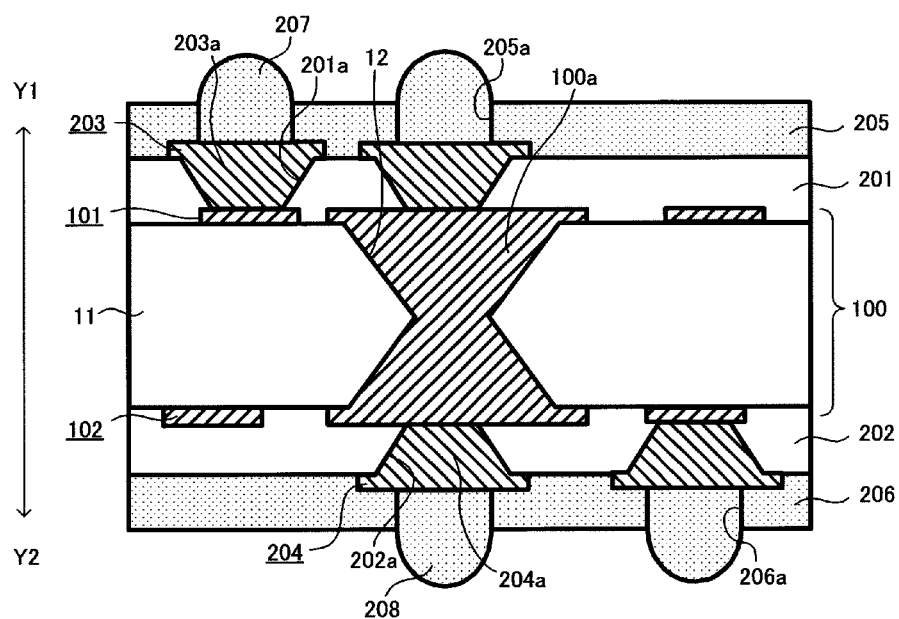
FIG. 18 is a cross-sectional view of an example showing a multilayer printed wiring board that is manufactured using a substrate with a metal film according to the first embodiment or the second embodiment.

FIG. 18 shows multilayer printed wiring board 200 manufactured using substrate 10 with a metal film. Multilayer printed wiring board 200 is a built-up printed wiring board having built-up layers on double-sided board 100.

Multilayer printed wiring board 200 has double-sided board 100 (core substrate) formed with insulative substrate 11 having penetrating hole 12, conductive circuit 101 formed on the first surface of insulative substrate 11, conductive circuit 102 formed on the second surface (the surface opposite the first surface) of insulative substrate 11, and through-hole conductor (100a) that connects conductive circuits 101 and 102 and fills penetrating hole 12. Moreover, multilayer printed wiring board 200 has the following: interlayer resin insulation layers 201, 202 laminated on double-sided board 100; conductive circuits 203, 204 formed on the surfaces of interlayer resin insulation layers 201, 202; via conductors (203a, 204a) that connect conductive circuits 101, 102 (conductive circuits of the core substrate) and conductive circuits 203, 204 on interlayer resin insulation layers 201, 202; solder-resist layers 205, 206 having openings (205a, 206a) that expose solder pads (parts of conductive circuits 203, 204); and solder bumps 207, 208 formed on the solder pads.

A method for manufacturing multilayer printed wiring board 200 is described in the following.

Figure 19:
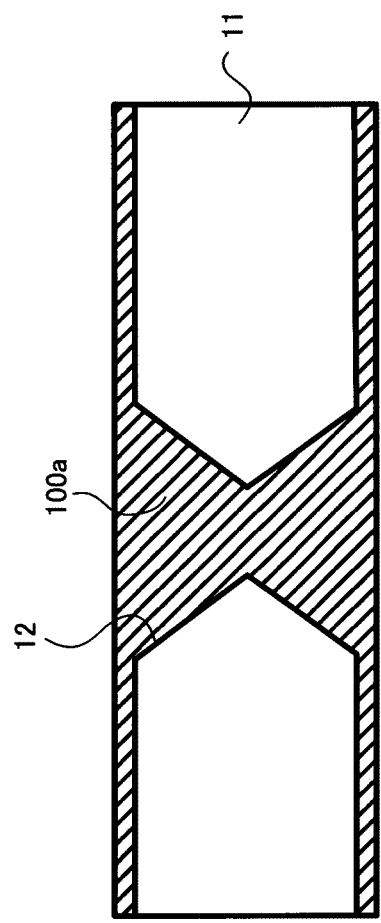
FIG. 19 is a cross-sectional view of an example showing a substrate having a through-hole conductor.

First, a substrate shown in FIG. 19 is manufactured. The substrate shown in FIG. 19 is formed from substrate 10 with a metal film (FIG. 16), for example. By filling penetrating hole 12 with electrolytic plated-metal film, through-hole conductor (100a) is formed. The electrolytic plated-metal film is formed on electroless plated-metal film 16 by using electroless plated-metal film 16 as a seed layer, for example. As for electroplating, electrolytic copper plating, electrolytic nickel plating, electrolytic solder plating or the like may be used. Among those, electrolytic copper plating is preferred.

Also, electroless plated-metal film 16 and electrolytic plated-metal film on electroless plated-metal film 16 are formed by means of a polymer layer on the first surface and the second surface of insulative substrate 11. In the same manner, electroless plated-metal film 16 and an electrolytic plated-metal film on electroless plated-metal film 16 are formed by means of a polymer layer on the inner walls of penetrating hole 12.

Next, an example of an electroplating method to be used in the present applied example is described. In such an example, substrate 10 with a metal film (FIG. 16) is immersed in a commercially available electrolytic copper plating solution, and electrolytic copper-plated film is formed on electroless copper-plated film. In doing so, conductive layers are formed on the first and second surfaces of insulative substrate 11. Also, penetrating hole 12 is filled with electrolytic copper-plated film.

Figure 20A:
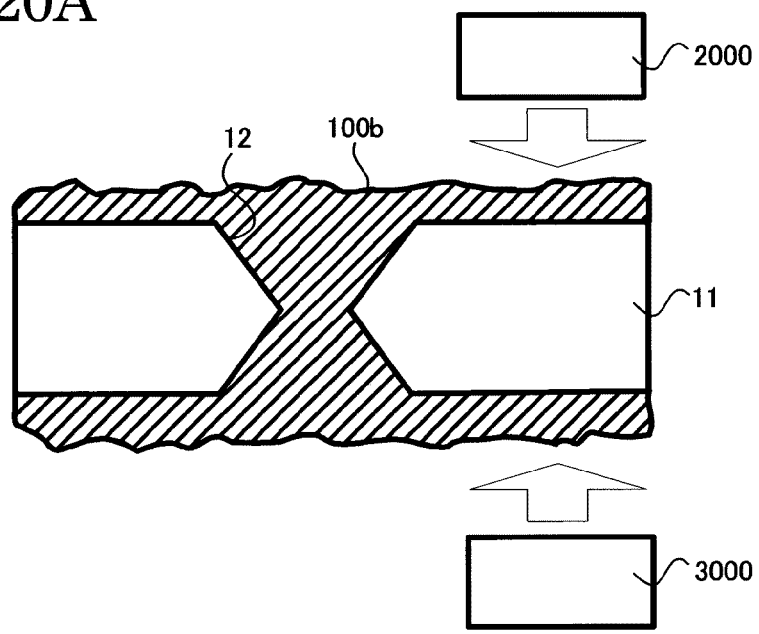
FIG. 20A is a view illustrating an example of a method for electrolytic plating.

Substrate 10 with a metal film (FIG. 16) is immersed in commercially available electrolytic plating solution (100b). As for electrolytic plating solution (100b), commercially available electrolytic copper plating solutions may be used. Then, as shown in FIG. 20A, insulative body 2000 is pressed against the first surface of insulative substrate 11; and insulative body 3000 is pressed against the second surface of insulative substrate 11. As for insulative bodies 2000, 3000, sponges, brushes or the like may be used.

Figure 20B:
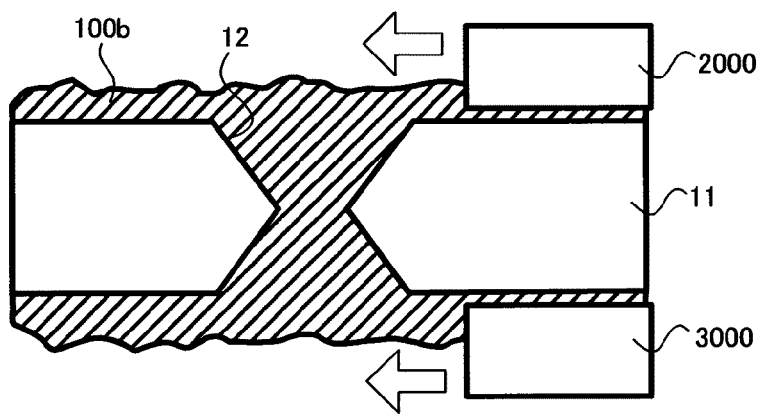
FIG. 20B is a view illustrating an example of a method for electrolytic plating.

Next, as shown in FIG. 20B, at least either insulative substrate 11 or insulative bodies 2000, 3000 are shifted. Namely, insulative substrate 11 is shifted relative to insulative bodies 2000, 3000. During that time, electrolytic plated-metal film is formed on electroless plated-metal film using the electroless plated-metal film as a seed. Conductive layers made up of electroless plated-metal film and electrolytic plated-metal film are formed on the first and second surfaces of insulative substrate 11. Electroless plated-metal film and electrolytic plated-metal film on the electroless plated-metal film are also formed on the inner walls of penetrating hole 12. Penetrating hole 12 is filled with electrolytic plated-metal film and through-hole conductor (100a) is formed (see FIG. 19). In the present applied example, such electroless plated-metal film is electroless copper-plated film, and electrolytic plated-metal film is electrolytic copper-plated film. With such a method, the conductive layers formed on the first and second surfaces of insulative substrate 11 may be made thinner than with electrolytic plating performed without using insulative bodies 2000, 3000. Also, since electrolytic plated-metal film is formed while insulative bodies 2000, 3000 are pressed against the polymer layer, adhesiveness between the polymer and the conductive layers tends to be strengthened. Accordingly, adhesiveness between smooth insulative substrate 11 and conductive layers can be enhanced. In addition, since the polymer layer has a lower elasticity modulus than insulative substrate 11, insulative bodies 2000, 3000 tend to correspond to the surfaces of insulative substrate 11. As a result, the thickness of the conductive layers formed on the first and second surfaces of insulative substrate 11 can become uniform.

Figure 21:
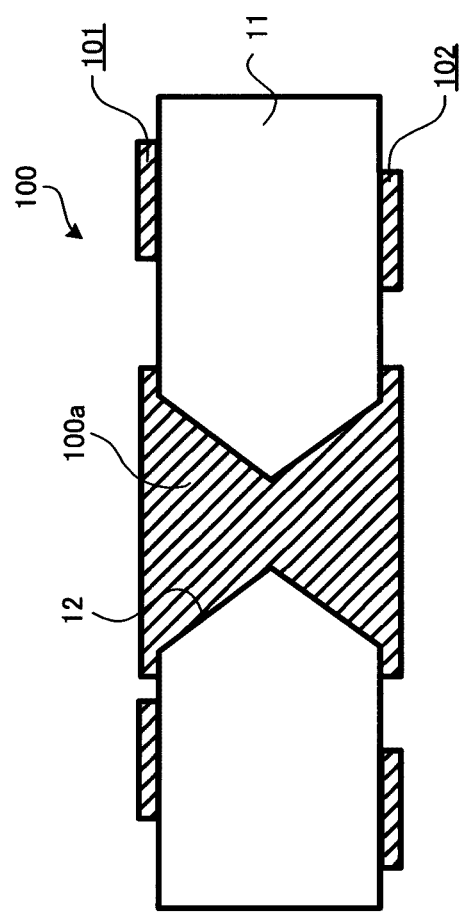
FIG. 21 is a view illustrating a step to form conductive circuits on the first and second surfaces of the insulative substrate.

A commercially available etching resist layer is formed on the conductive layers on both surfaces of through-hole conductor (100a) and conductive layers on both surfaces of insulative substrate 11. Then, patterned etching resists are formed on insulative substrate 11. Next, the conductive layers left exposed by the etching resists are etched away. As shown in FIG. 21, conductive circuit 101 is formed on the first surface of insulative substrate 11 and conductive circuit 102 is formed on the second surface of insulative substrate 11. Conductive circuits 101 and 102 are connected by through-hole conductor (100a). Accordingly, double-sided board 100 is complete. Conductive circuits 101, 102 may be formed using a well-known semi-additive method.

Figure 22A:
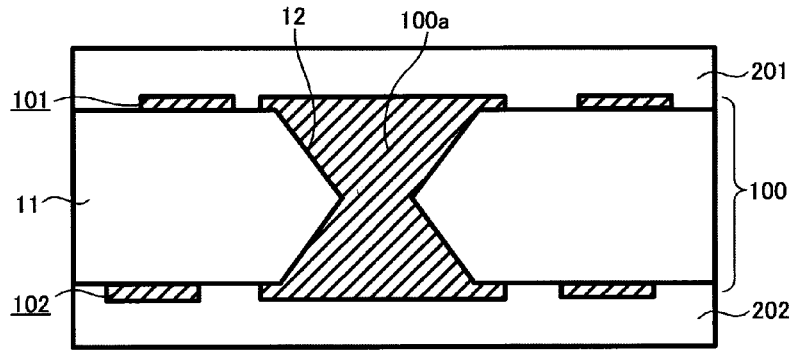
FIG. 22A is a view illustrating a step to form interlayer resin insulation layers on the first and second surfaces of a core substrate.

Using double-sided board 100 as a core substrate, interlayer resin insulation layers 201, 202 are formed on both surfaces of double-sided board 100, as shown in FIG. 22A. Interlayer resin insulation layers 201, 202 are formed by laminating insulation film (such as ABF series made by Ajinomoto Fine-Techno Co., Inc.) on double-sided board 100 and by thermosetting such insulative film.

Figure 22B:
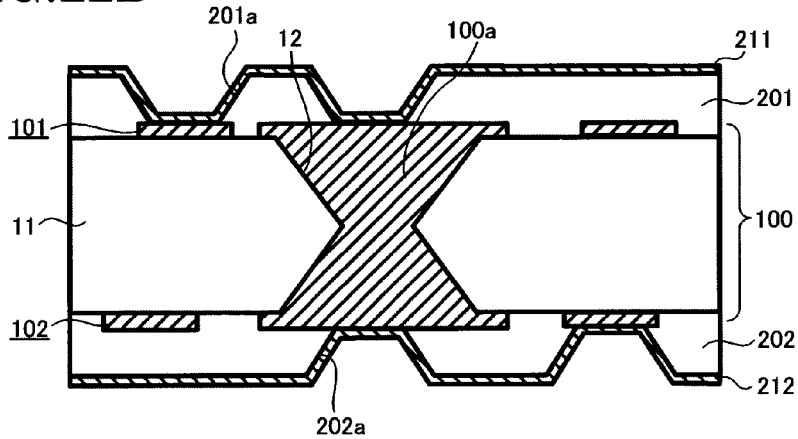
FIG. 22B is a view illustrating a step to form a via-conductor opening and a seed layer.

Next, as shown in FIG. 22B, a laser is beamed onto interlayer resin insulation layers 201, 202, and via-conductor openings (201a, 202a) are formed to reach conductive circuits 101, 102 on double-sided board 100 or through-hole conductor (100a). Electroless plated-metal films 211, 212 are formed on the inner walls of openings (201a, 202a) and on interlayer resin insulation layers 201, 202. As for such electroless plating, electroless copper plating or electroless nickel plating may be used. Among those, electroless copper plating is especially preferred. Sputtered films may be used instead of electroless plating. In the present applied example, electroless copper-plated film is formed. Electroless plated-metal film and sputtered film function as a seed layer.

Figure 22C:
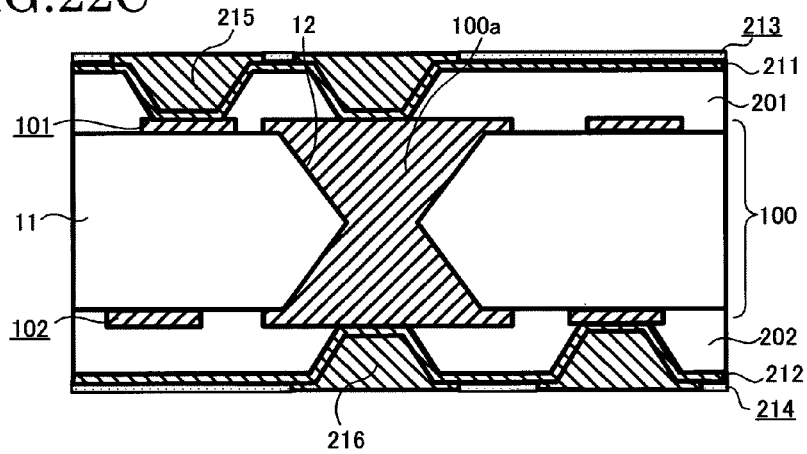
FIG. 22C is a view illustrating a step to form an electrolytic plated-metal film on the seed layer.

Next, plating resists 213, 214 are formed on electroless plated-metal films 211, 212. After the plating resists are developed, electrolytic plated-metal films 215, 216 are formed on electroless plated-metal films 211, 212 left exposed by plating resists 213, 214, as shown in FIG. 22C. As for such electrolytic plating, electrolytic copper plating or electrolytic nickel plating may be used. Among those, electrolytic copper plating is especially preferred. In the present applied example, electrolytic copper-plated film is formed.

Figure 23A:
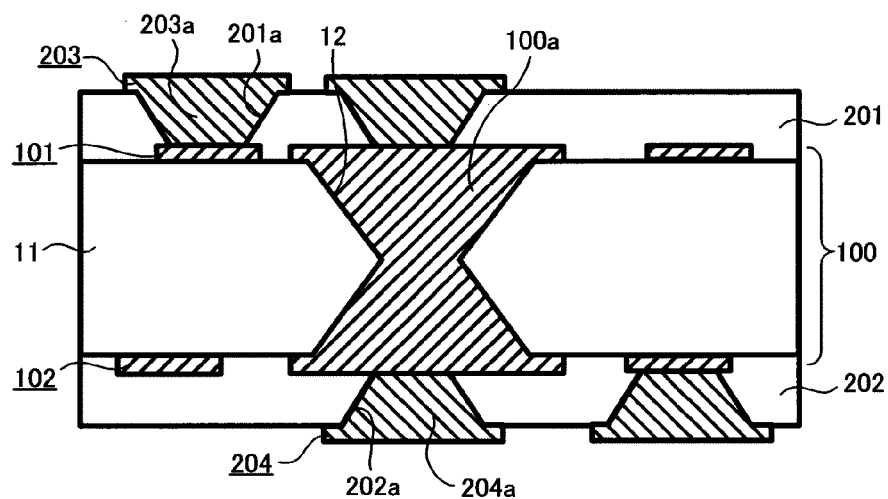
FIG. 23A is a view illustrating a patterning step to form a conductive circuit and a via conductor.

Plating resists 213, 214 are removed. Then, electroless plated-metal films 211, 212 left exposed by electrolytic plated-metal films 215, 216 are removed. In doing so, as shown in FIG. 23A, conductive circuits 203, 204 and via conductors (203a, 204a) are formed, made up of electroless plated-metal films 211, 212 and electrolytic plated-metal films 215, 216.

When sputtered film is used as a seed layer, conductive circuits 203, 204 and via conductors (203a, 204a) are formed, made up of a sputtered film and electrolytic plated-metal film on the sputtered film. As via conductors (203a, 204a), it is preferred to use filled vias formed by filling plating in openings (201a, 202a) formed in interlayer resin insulation layers 201, 202. By means of via conductors (203a, 204a), conductive circuits 101, 102 of double-sided board 100, for example, conductive circuits 101, 102 on both sides of through-hole conductor (100a) or the like are connected to conductive circuits 203, 204 on interlayer resin insulation layers 201, 202.

Next, by repeating the procedure from a step to form interlayer resin insulation layers 201, 202 to a patterning step the same number of times as the number of layers to be laminated, a multilayer substrate is formed.

Figure 23B:
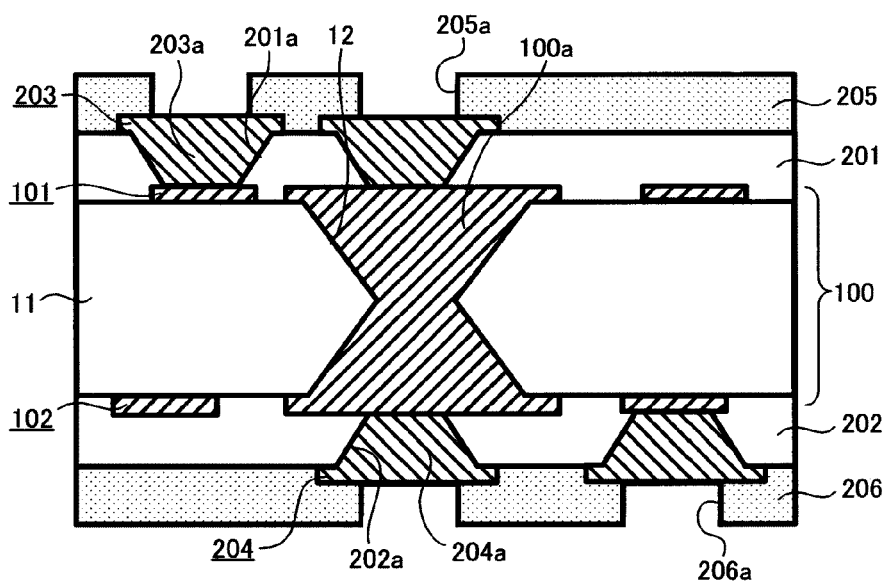
FIG. 23B is a view illustrating a step to form a solder-resist layer with an opening.

In the following, liquid or dry-film type photosensitive resist (solder resist) is applied or laminated on both main surfaces of the substrate. Here, thermosetting solder resist may also be used. Then, a mask film with a predetermined pattern is adhered to the surfaces of the photosensitive resist, which is exposed to ultraviolet rays and developed with an alkaline solution. As a result, as shown in FIG. 23B, solder-resist layers 205, 206 are formed having openings (205a, 206a) to expose the portions of conductive circuits 203, 204 which will become solder pads. Openings (205a, 206a) of solder-resist layers 205, 206 may be such openings that expose partially or entirely portions of conductive circuits 203, 204 on via conductors (203a, 204a). Also, openings (205a, 206a) may be such openings that expose portions of conductive circuits 203, 204 extended from via conductors (203a, 204a) instead of exposing conductive circuits 203, 204 on via conductors (203a, 204a).

In the following, solder paste is printed on solder pads and reflowed to form solder bumps 207, 208. Multilayer printed wiring board 200 (FIG. 18) manufactured as above will be electrically connected to electronic components such as an IC chip, daughterboard or the like by means of solder bumps 207, 208.

As previously shown in FIG. 9B, according to the manufacturing method of the present embodiment, the entire inner walls of penetrating hole 12 are irradiated with energy (such as UV) in a substantially uniform manner. Therefore, excellent adhesiveness between electroless plated-metal film 16 and insulative substrate 11 may be achieved in penetrating hole 12 as well. The direction of energy irradiated onto insulative substrate 11 may be set perpendicular to the first surface and the second surface of the substrate. Alternatively, such energy may be irradiated obliquely.

Moreover, in the manufacturing method of the present embodiment, the plating catalyst (metal 15) attached to graft polymer 14 is used as electroless plating nuclei when forming electroless plated-metal film 16. Therefore, strong adhesiveness is achieved between insulative substrate 11 and metal film (electroless plated-metal film 16) despite the smooth surfaces of insulative substrate 11.

So far, a substrate with a metal film and its manufacturing method according to an embodiment of the present invention are described. However, the present invention is not limited to such.

Figure 24:
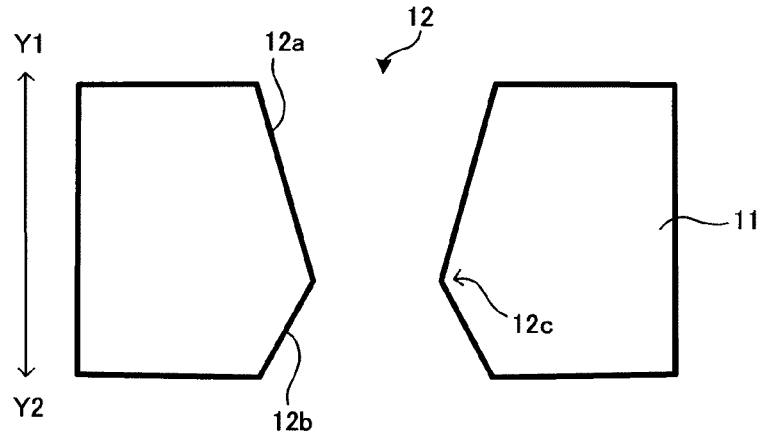
FIG. 24 is a cross-sectional view of a first alternate example showing the shape of a penetrating hole.

In the above first embodiment, first opening (12a) and second opening (12b) of penetrating hole 12 are configured to be symmetrical at the bottleneck portion (12c). However, the present invention is not limited to such; for example, as shown in FIG. 24, penetrating hole 12 may also be configured to be asymmetrical at bottleneck portion (12c).

Figure 25A:
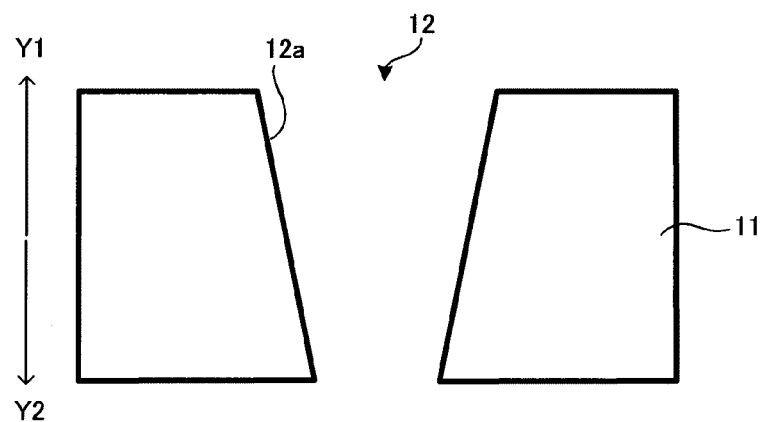
FIG. 25A is a cross-sectional view of a second alternate example showing the shape of a penetrating hole.
Figure 25B:
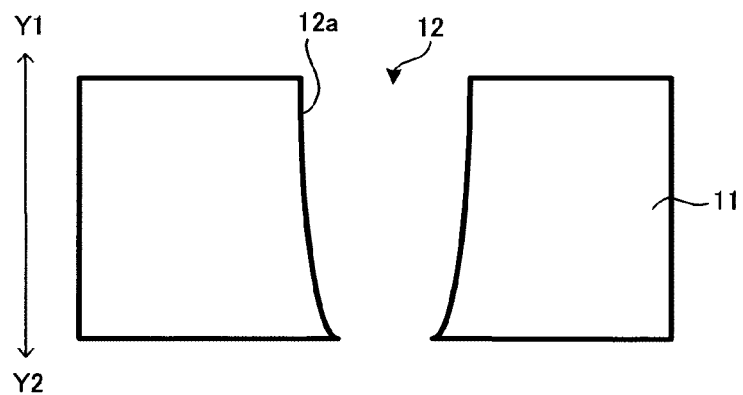
FIG. 25B is a cross-sectional view of a third alternate example showing the shape of a penetrating hole.

Alternatively, as shown in FIG. 25A or FIG. 25B, penetrating hole 12 may be configured in such a way that its inner wall tapers from the first surface (the arrow-Y1 side) to the second surface (the arrow-Y2 side). Tapering from the first surface to the second surface includes cases in which penetrating hole 12 becomes gradually narrower from the first surface toward the second surface. FIG. 25A shows the inner wall inclining substantially in a straight line; and FIG. 25B shows penetrating hole 12 becoming gradually narrower from the first surface toward the second surface. In such cases, by beaming the laser at insulative substrate 11 from the arrow-Y1 side (first surface of insulative substrate 11), penetrating hole 12 will be configured as shown in FIG. 25A or FIG. 25B. The laser is not beamed at insulative substrate 11 from the second-surface side of the substrate. Also, by irradiating the inner wall of penetrating hole 12 with energy such as UV from the arrow-Y1 side (the first surface of the insulative substrate), the entire inner wall of penetrating hole 12 is irradiated with energy in a substantially uniform manner.

Figure 26A:
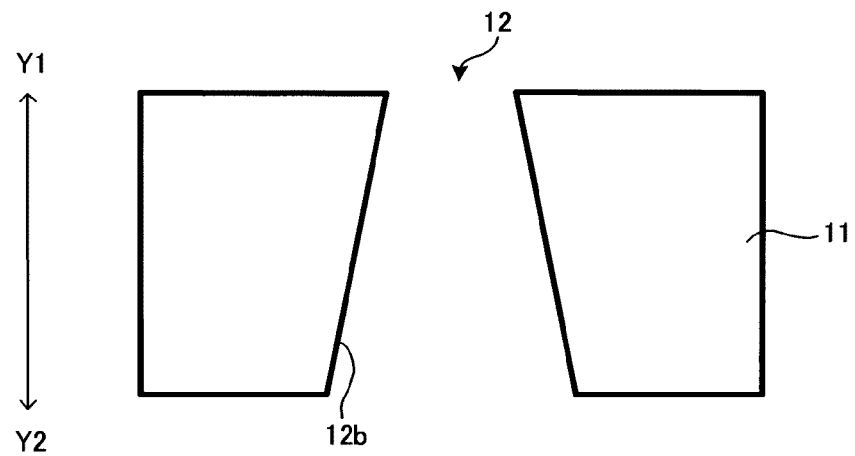
FIG. 26A is a cross-sectional view of a fourth alternate example showing the shape of a penetrating hole.
Figure 26B:
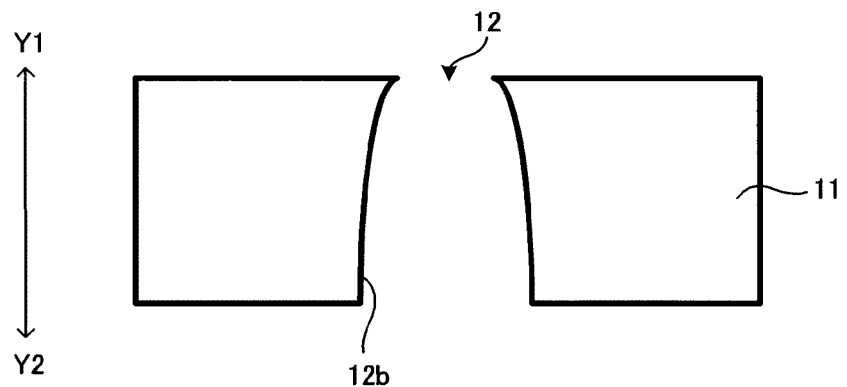
FIG. 26B is a cross-sectional view of a fifth alternate example showing the shape of a penetrating hole.

Also, FIG. 26A and FIG. 26B show examples in which the inner wall of penetrating hole 12 tapers from the second surface to the first surface. Tapering from the second surface to the first surface includes cases in which penetrating hole 12 becomes gradually narrower from the first surface toward the second surface. FIG. 26A shows the inner wall inclining substantially in a straight line; and FIG. 26B shows penetrating hole 12 becoming gradually narrower from the second surface of insulative substrate 11 toward the first surface. In such cases, by beaming the laser at insulative substrate 11 from the arrow-Y2 side (second surface of insulative substrate 11), penetrating hole 12 will be configured as shown in FIG. 26A or FIG. 26B. Also, by irradiating the inner wall of penetrating hole 12 with energy such as UV from the arrow-Y2 side (second surface of the insulative substrate), the entire inner wall of penetrating hole 12 is irradiated with energy in a substantially uniform manner.

Penetrating holes 12 as shown in FIG. 25A, 25B, 26A or 26B may be formed by beaming a laser at one surface of insulative substrate 11. Forming such penetrating holes is easier than forming penetrating hole 12 shown in FIG. 4 and other drawings.

Figure 27A:
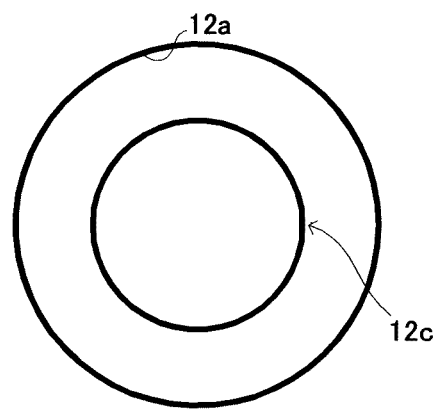
FIG. 27A is a plan view of a sixth alternate example showing the shape of a penetrating hole.
Figure 27B:
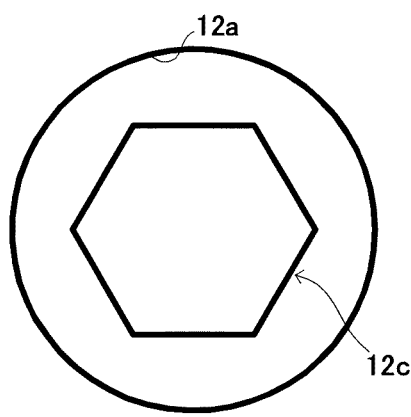
FIG. 27B is a plan view of a seventh alternate_example showing the shape of a penetrating hole.

The shape of the opening of penetrating hole 12 (FIG. 4) when carved at any given plane may be similar, with its diameter becoming smaller toward the bottleneck portion (12c) as shown in FIG. 27A. Alternatively, the shape of the opening may be different when carved at any given plane, with its size becoming smaller toward the bottleneck portion as shown in FIG. 27B.

In the above embodiments, the quality, size and the number of layers of each layer may be modified freely.

The order of the steps in the above embodiments may be changed unless such a change deviates from the gist of the present invention. Also, some steps may be omitted according to usage requirements or others. For example, a substrate with a catalyst is immersed in an electrolytic plating solution such as an electrolytic copper plating solution so that electrolytic plated-metal film such as electrolytic copper-plated film may be formed on a polymer layer using the catalyst as a seed. In such a case, conductive circuits formed on the first and second surfaces of the substrate along with through-hole conductors are made with electrolytic plated-metal film.

A method for manufacturing a substrate with a metal film according to the first aspect of the present invention is as follows: preparing an insulative substrate having a first surface and a second surface opposite the first surface; in the insulative substrate, forming a penetrating hole whose inner wall tapers from the first surface of the insulative substrate toward the second surface; forming a composition containing a polymerization initiator and a polymerizable compound on the inner wall of the penetrating hole; forming a polymer on the inner wall of the penetrating hole by irradiating the composition with energy; applying a plating catalyst on the polymer; and forming a plated-metal film on the inner wall of the penetrating hole.

A method for manufacturing a substrate with a metal film according to the second aspect of the present invention is as follows: preparing an insulative substrate having a first surface and a second surface opposite the first surface; in the insulative substrate, forming a first opening whose inner wall tapers from the first surface of the insulative substrate toward the second surface; by forming a second opening whose inner wall tapers from the second surface of the insulative substrate toward the first surface, forming a penetrating hole made up of the first opening and the second opening in the insulative substrate; on the inner walls of the penetrating hole, forming a composition containing a polymerization initiator and a polymerizable compound; on the inner walls of the penetrating hole, forming a polymer by irradiating the composition with energy; applying a plating catalyst on the polymer; and forming a plated-metal film on the inner walls of the penetrating hole.

A method for manufacturing a substrate with a metal film according to the third aspect of the present invention is as follows: preparing an insulative substrate having a first surface and a second surface opposite the first surface; in the insulative substrate, forming a penetrating hole whose inner wall tapers from the first surface of the insulative substrate toward the second surface; irradiating with energy the first surface of the insulative substrate, the second surface of the insulative substrate and the inner wall of the penetrating hole; forming a composition containing a polymerizable compound on the first surface of the insulative substrate, the second surface of the insulative substrate and the inner wall of the penetrating hole; forming a polymer on the first surface of the insulative substrate, the second surface of the insulative substrate and the inner wall of the penetrating hole; applying a plating catalyst on the polymer; and forming a plated-metal film on the inner wall of the penetrating hole.

A method for manufacturing a substrate with a metal film according to the fourth aspect of the present invention is as follows: preparing an insulative substrate having a first surface and a second surface opposite the first surface; in the insulative substrate, forming a first opening whose inner wall tapers from the first surface of the insulative substrate toward the second surface; by forming a second opening whose inner wall tapers from the second surface of the insulative substrate toward the first surface, forming a penetrating hole made up of the first opening and the second opening in the insulative substrate; irradiating with energy the first surface of the insulative substrate, the second surface of the insulative substrate and the inner walls of the penetrating hole; forming a composition containing a polymerizable compound on the first surface of the insulative substrate, the second surface of the insulative substrate and the inner walls of the penetrating hole; forming a polymer on the first surface of the insulative substrate, the second surface of the insulative substrate and the inner walls of the penetrating hole; applying a plating catalyst on the polymer; and forming a plated-metal film on the inner wall of the penetrating hole.

"Preparing" includes cases in which materials and components are purchased and a substrate is manufactured, as well as cases in which a finished substrate is purchased and used.

In addition, irradiation of energy includes irradiating electromagnetic beams, and other types of light such as electron beams, X-rays, plasma beams, corona discharge or ion beams. In short, it is sufficient if energy is irradiated in a predetermined direction.

A substrate with a metal film according to the fifth aspect of the present invention is formed with the following: an insulative substrate having a first surface and a second surface opposite the first surface along with a penetrating hole whose inner wall tapers from the first surface toward the second surface; a polymer formed on the inner wall of the penetrating hole and having a functional group that is bondable with a catalyst for depositing a plated-metal film; and a plated-metal film formed on the inner wall of the penetrating hole.

A substrate with a metal film according to the sixth aspect of the present invention is formed with the following: an insulative substrate having a first surface and a second surface opposite the first surface along with a penetrating hole made up of a first opening whose inner wall tapers from the first surface toward the second surface and of a second opening whose inner wall tapers from the second surface toward the first surface; a polymer formed on the inner walls of the penetrating hole and having a functional group that is bondable with a catalyst for depositing a plated-metal film; and a plated-metal film formed on the inner walls of the penetrating hole.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a substrate with a metal film, comprising:
    preparing an insulative substrate having a first surface and a second surface on an opposite side of the first surface;
    forming in the insulative substrate a penetrating hole having an inner wall tapering from the first surface of the insulative substrate toward the second surface;
    forming a layer of a composition comprising a polymerization initiator and a polymerizable compound on the inner wall of the penetrating hole;
    irradiating the layer of the composition with energy such that the polymerizable compound in the composition undergoes polymerization and a polymer is produced through the polymerization of the polymerizable compound and formed on the inner wall of the penetrating hole;
    applying a plating catalyst on the polymer; and
    forming a plated-metal film on the inner wall of the penetrating hole.

2. The method for manufacturing a substrate with a metal film according to claim 1, further comprising conducting a plasma treatment on the inner wall of the penetrating hole.

3. The method for manufacturing a substrate with a metal film according to claim 1, wherein the irradiating of the layer of the composition comprises irradiating the layer of the composition with energy such that a polymer having a functional group to be bonded with the catalyst is formed on the inner wall of the penetrating hole.

4. The method for manufacturing a substrate with a metal film according to claim 1, wherein the irradiating comprises irradiating UV rays upon the layer of the composition.

5. The method for manufacturing a substrate with a metal film according to claim 1, further comprising:
    smoothing the first surface and second surface of the insulative substrate; and forming the plated-metal film on the first surface of the insulative substrate and on the second surface of the insulative substrate.

6. The method for manufacturing a substrate with a metal film according to claim 1, wherein the forming of the layer of the composition comprises forming the layer of the composition on the inner wall of the penetrating hole and at least one of the first and second surfaces of the insulative substrate.

7. The method for manufacturing a substrate with a metal film according to claim 1, wherein the polymerization initiator in the composition is a photopolymerization initiator, and the polymerizable compound in the composition is a monomer which is polymerizable by the photopolymerization initiator.

8. The method for manufacturing a substrate with a metal film according to claim 1, wherein the polymerization initiator in the composition is a thermal polymerization initiator, and the polymerizable compound in the composition is a monomer which is polymerizable by the thermal polymerization initiator.

9. The method for manufacturing a substrate with a metal film according to claim 1, wherein the polymerization initiator in the composition is a radical polymerization initiator, and the polymerizable compound in the composition is a monomer which is polymerizable by the radical polymerization initiator.

10. The method for manufacturing a substrate with a metal film according to claim 1, wherein the polymerizable compound in the composition is a hydrophobic polymer having a polymerizable group which is polymerizable by the polymerization initiator.

11. A method for manufacturing a substrate with a metal film, comprising:
    preparing an insulative substrate having a first surface and a second surface on an opposite side of the first surface;
    forming in the insulative substrate a first opening having an inner wall tapering from the first surface of the insulative substrate toward the second surface;
    forming in the insulative substrate a second opening having an inner wall tapering from the second surface of the insulative substrate toward the first surface such that a penetrating hole comprising the first opening and the second opening is formed in the insulative substrate;
    forming on the inner walls of the penetrating hole a layer of a composition comprising a polymerization initiator and a polymerizable compound;
    irradiating the layer of the composition with energy such that the polymerizable compound in the composition undergoes polymerization and a polymer is produced through the polymerization of the polymerizable compound and formed on the inner walls of the penetrating hole;
    applying a plating catalyst on the polymer; and
    forming a plated-metal film on the inner walls of the penetrating hole.

12. The method for manufacturing a substrate with a metal film according to claim 11, further comprising conducting a plasma treatment on the inner walls of the penetrating hole.

13. The method for manufacturing a substrate with a metal film according to claim 11, wherein the irradiating of the layer of the composition comprises irradiating the layer of the composition with energy from the first surface of the substrate and irradiating the layer of the composition with energy from the second surface of the substrate.

14. The method for manufacturing a substrate with a metal film according to claim 11, wherein the irradiating of the layer of the composition comprises irradiating the layer of the composition with energy such that a polymer having a functional group to be bonded with the catalyst is formed on the inner wall of the penetrating hole.

15. The method for manufacturing a substrate with a metal film according to claim 11, wherein the irradiating comprises irradiating UV rays upon the layer of the composition.

16. The method for manufacturing a substrate with a metal film according to claim 11, further comprising:
    smoothing the first surface and second surface of the insulative substrate; and
    forming the plated-metal film on the first surface of the insulative substrate and on the second surface of the insulative substrate.

17. The method for manufacturing a substrate with a metal film according to claim 11, wherein the forming of the layer of the composition comprises forming the layer of the composition on the inner wall of the penetrating hole and at least one of the first and second surfaces of the insulative substrate.

18. The method for manufacturing a substrate with a metal film according to claim 11, wherein the polymerization initiator in the composition is a thermal polymerization initiator, and the polymerizable compound in the composition is a monomer which is polymerizable by the thermal polymerization initiator.

19. The method for manufacturing a substrate with a metal film according to claim 11, wherein the polymerization initiator in the composition is a radical polymerization initiator, and the polymerizable compound in the composition is a monomer which is polymerizable by the radical polymerization initiator.

20. The method for manufacturing a substrate with a metal film according to claim 11, wherein the polymerizable compound in the composition is a hydrophobic polymer having a polymerizable group which is polymerizable by the polymerization initiator.

21. The method for manufacturing a substrate with a metal film according to claim 11, wherein the polymerizable compound in the composition is a hydrophobic polymer having a polymerizable group which is polymerizable by the polymerization initiator.

* * * * *